(12) United States Patent
Cui et al.

(10) Patent No.: US 11,656,263 B2
(45) Date of Patent: May 23, 2023

(54) EFFECTIVE FEATURE SET-BASED HIGH IMPEDANCE FAULT DETECTION

(71) Applicants: Qiushi Cui, Tempe, AZ (US); Yang Weng, Chandler, AZ (US); Khalil El-Arroudi, Montreal (CA); Syed Muhammad Yousaf Hashmy, Tempe, AZ (US)

(72) Inventors: Qiushi Cui, Tempe, AZ (US); Yang Weng, Chandler, AZ (US); Khalil El-Arroudi, Montreal (CA); Syed Muhammad Yousaf Hashmy, Tempe, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 218 days.

(21) Appl. No.: 16/897,542

(22) Filed: Jun. 10, 2020

(65) Prior Publication Data
US 2020/0393505 A1      Dec. 17, 2020

Related U.S. Application Data

(60) Provisional application No. 62/859,929, filed on Jun. 11, 2019.

(51) Int. Cl.
*G01R 31/08* (2020.01)
*G01R 21/06* (2006.01)
(Continued)

(52) U.S. Cl.
CPC ........... *G01R 31/085* (2013.01); *G01R 21/06* (2013.01); *H02H 1/0007* (2013.01);
(Continued)

(58) Field of Classification Search
CPC .... G01R 31/085; G01R 21/06; H02H 1/0007; H02H 7/22; H02H 1/0092; H02H 3/387; H02H 3/52
See application file for complete search history.

(56) References Cited

U.S. PATENT DOCUMENTS 4,466,071 A      8/1984  Russell, Jr.
5,578,931 A *  11/1996  Russell .............. G01R 31/1272
                                                            324/536
(Continued)

FOREIGN PATENT DOCUMENTS

CN           113759206 A       12/2021

OTHER PUBLICATIONS

Gogula Vyshnavi, Avagaddi Prasad (Detection and Location of High Impedance Faults in Distribution Systems: A Review) (Year: 2018).*
(Continued)

*Primary Examiner* — Feba Pothen
*Assistant Examiner* — Joseph O Nyamogo
(74) *Attorney, Agent, or Firm* — Withrow & Terranova, P.L.L.C.

(57) ABSTRACT

Effective feature set-based high impedance fault (HIF) detection is provided. Systems, methods and devices described herein present a systematic design of power feature extraction for HIF detection and classification. For example, power features associated with HIF events are extracted according to when a fault happens, how long it lasts, and the magnitude of the fault. Complementary power expert information is also integrated into feature pools. In another aspect, a ranking procedure is deployed in a feature pool for balancing information gain and complexity in order to avoid over-fitting of features. In aspects described herein, a logic-based HIF detector implements HIF feature extraction. To determine when an HIF occurs, the HIF detector
(Continued)

calculates different quantities, such as active power and reactive power, based on a voltage and current time series, and uses the derivative of these quantities to tell when there is a potential change due to HIF.

17 Claims, 8 Drawing Sheets

(51) Int. Cl.
    *H02H 1/00*     (2006.01)
    *H02H 7/22*     (2006.01)
    *H02H 3/38*     (2006.01)
    *H02H 3/52*     (2006.01)

(52) U.S. Cl.
    CPC .............. *H02H 3/387* (2013.01); *H02H 7/22* (2013.01); *H02H 1/0092* (2013.01); *H02H 3/52* (2013.01)

(56) References Cited

U.S. PATENT DOCUMENTS

| | | |
|---|---|---|
| 2012/0086459 A1 | 4/2012 | Kim |
| 2017/0336465 A1 | 11/2017 | Pignati et al. |
| 2019/0379209 A1 | 12/2019 | Mohsenian-Rad et al. |

OTHER PUBLICATIONS

VIZIMAX Inc. (Phaser Measurement Unit (PMU) Datasheet: PMU01000) (Year: 2017).*
Ali-Reza Sedighi, Mahmood-Reza Haghifam, Mohammad-Hassan Ghassemian (High Impedance Fault Detection Based on Wavelet Transform and Statistical Pattern Recognition) (Year: 2005).*
Fernando Calero (Rebirth of Negative-Sequence Quantities in Protective Relaying With Microprocessor-Based Relays) (Year: 2004).*
Benner et al., "Practical high-impedance fault detection on distribution feeders," IEEE Transaction on Industry Applications, vol. 33, No. 3; May/Jun. 1997, pp. 635-640.
Carr, J., "Detection of High Impedance Faults on Multi-Grounded Primary Distribution Systems," IEEE Transactions on Power Apparatus and Systems, vol. PAS-100, No. 4, Apr. 1981, pp. 2008-2016.
Chaderi et al., "High impedance fault detection: a review," Electric Power Systems Research, vol. 143, Feb. 2017, pp. 376-388.
Chawla et al., "SMOTE: synthetic minority over-sampling technique," Journal of Artificial Intelligence Research, vol. 16, Jun. 2002, pp. 321-357.
Choi et al., "A new fault location algorithm using direct circuit analysis for distribution systems," IEEE Transactions on Power Delivery, vol. 19, No. 1, Jan. 7, 2004, pp. 35-41.
Cui et al., "Islanding detection of hybrid distributed generation under reduced non-detection zone," IEEE Transactions on Smart Grid, vol. 9, No. 5, Mar. 7, 2017, pp. 5027-5037.
De Oliveira et al., "A new methodology for high impedance fault detection, classification and location using PMUs," 2018 Simposio Brasileiro de Sistemas Eletricos (SBSE), IEEE, May 12-16, 2018, Niteroi, Brazil, 6 pages.
Ding et al., "Transmission line parameters identification based on moving-window TLS and PMU data," 2011 International Conference on Advanced Power System Automation and Protection, IEEE, Oct. 16-20, 2011, Beijing, China, pp. 2187-2191.
Elkalashy et al., "DWT-based detection and transient power direction-based location of high-impedance faults due to leaning trees in unearthed MV networks," IEEE Transaction on Power Delivery, vol. 23, No. 1 , Dec. 26, 2007, pp. 94-101.
Elkalashy et al., "Modeling and experimental verification of high impedance arcing fault in medium voltage networks," IEEE Transactions on Dielectics and Electrical Insulation, vol. 14, No. 2, Apr. 10, 2007, pp. 375-383.
Emanuel et al., "High impedance fault arcing on sandy soil in 15 kV distribution feeders: contributions to the evaluation of the low frequency spectrum," IEEE Transactions on Power Delivery, vol. 5, No. 2, Apr. 1990, pp. 676-686.
Etemadi et al., "High-impedance fault detection using multi-resolution signal decomposition and adaptive neural fuzzy inference system," IET Generation, Transmission & Distribution, vol. 2, No. 1, The Institution of Engineering and Technology, Jan. 21, 2008, pp. 110-118.
Farajollahi et al., "Deployment of fault indicator in distribution networks: A MIP-based approach," IEEE Transactions on Smart Grid, vol. 9, No. 3, May 2018, pp. 2259-2267.
Farajollahi et al., "Locating the source of events in power distribution systems using micro-PMU data," IEEE Transactions on Power Systems, vol. 33, No. 6, Oct. 24, 2016, pp. 6343-6354.
Farajollahi et al., "Location identification of high impedance faults using synchronized harmonic phasors," 2017 IEEE Power & Energy Society Innovative Smart Grid Technologies Conference, Apr. 23-26, 2017, Washington, DC, 5 pages.
Gautam et al., "Detection of high impedance fault in power distribution systems using mathematical morphology," IEEE Transaction on Power Systems, vol. 28, No. 2, Sep. 24, 2012, pp. 1226-1234.
Ghaderi et al., "High-impedance fault detection in the distribution network using the time-frequency-based algorithm," IEEE Transactions on Power Delivery, vol. 30, No. 3, Oct. 3, 2014, pp. 1260-1268.
Girgis et al., "Analysis of highimpedance fault generated signals using a kalman filtering approach," IEEE Transactions on Power Delivery, vol. 5, No. 4, Oct. 1990, pp. 1714-1724.
Haghifam et al., "Development of a fuzzy inference system based on genetic algorithm for high-impedance fault detection," IEE Proceedings—Generation, Tranmission, and Distribution, vol. 153, No. 3, May 11, 2006, pp. 359-367.
Hou, D., "Detection of high-impedance faults in power distribution systems," Power Systems Conference: Advanced Metering, Protection Control, Communication, and Distributed Resources, IEEE, Mar. 13-16, 2007, Clemson, SC, pp. 85-95.
Huang et al., "A novel method of ground fault phase selection in weak-infeed side," IEEE Transactions on Power Delivery, vol. 29, No. 5, May 20, 2014, pp. 2215-2222.
IEEE Power and Energy Society, "IEEE Std C37.118.1-2011: IEEE Standard for Synophasor Measurements for Power Systems," IEEE, New York, NY, Dec. 28, 2011, 61 pages.
IEEE Standards Coordinating Committee 21, "IEEE Std 1547-2018: IEEE Standard for Interconnection and Interoperability of Distributed Energy Resources with Associated Electric Power Systems Interfaces," IEEE, New York, NY, Apr. 6, 2018, 138 pages.
Jamali et al., "Fault location method for distribution networks using 37-buses distributed parameter line model," 2004 Eight IEE International Conference on Developments in Power System Protection, The Institution of Electrical Engineers, Apr. 5-8, 2004, Amsterdam, Netherlands, pp. 216-219.
Jamei et al., "Anomaly Detection Using Optimally Placed µPMU Sensors in Distribution Grids," IEEE Transactions on Power Systems, vol. 33, No. 4, Oct. 25, 2017, pp. 3611-3623.
Kamwa et al., "Compliance analysis of PMU algorithms and devices for wide-area stabilizing control of large power systems," IEEE Transaction on Power Systems, vol. 28, No. 2, Nov. 12, 2012, pp. 1766-1778.
Kamwa et al., "Wide frequency range adaptive phasor and frequency PMU algorithms," IEEE Transactions on Smart Grid, vol. 5, No. 2, Aug. 6, 2013, pp. 569-579.
Kantra et al., "Application of PMU to detect high impedance fault using statistical analysis," IEEE Power and Energy Society General Meeting, Jul. 17-21, 2016, Boston, MA, 5 pages.
Kersting et al., "Distribution Feeder Line Models," IEEE Transactions on Industry Applications, vol. 31, No. 4, Jul./Aug. 1995, pp. 715-720.
Kim et al., "A learning method for use in intelligent computer relays for high impedance faults," IEEE Transactions on Power Delivery, vol. 6, No. 1, Jan. 1991, pp. 109-111.

(56) References Cited

OTHER PUBLICATIONS

Kim et al., "A parameter-based process for selecting high impedance fault detection techniques using decision making under incomplete knowledge," IEEE Transactions on Power Delivery, vol. 5, No. 3, Jul. 1990, pp. 1314-1320.

Kizilcay et al., "Digital simulation of fault arcs in power systems," European Transactions on Electrical Power, vol. 1, No. 1, Jan./Feb. 1991, pp. 55-60.

Kohavi et al., "Wrappers for feature subset selection," Artifical Intelligence, vol. 97, No. 1-2, Dec. 1997, pp. 273-324.

Kwon et al., High impedance fault detection utilizing incremental variance of normalized even order harmonic power, IEEE Transactions on Power Delivery, vol. 6, No. 2, Apr. 1991, pp. 557-564.

Laaksonen et al., "Method for high-impedance fault detection," 24th International Conference & Exhibition on Electricity Distribution (CIRED)—Open Access Proceedings Journal, vol. 2017, No. 1, The Institution of Engineering and Technology, Jun. 12-15, 2017, pp. 1295-1299.

Lai et al., "High-impedance fault detection using discrete wavelet transform and frequency range and RMS conversion," IEEE Transactions on Power Delivery, vol. 20, No. 1, Jan. 2005, pp. 397-407.

Li et al., "Transient stability prediction based on apparent impedance trajectory recorded by PMUs," International Journal of Electrical Power & Energy Systems, vol. 54, Jan. 2014, pp. 498-504.

Iurinic et al., "Distribution systems high-impedance fault location: A parameter estimation approach," IEEE Transactions on Power Delivery, vol. 31, No. 4, Dec. 17, 2015, pp. 1806-1814.

Macedo et al., "Proposition of an interharmonic-based methodology for high-impedance fault detection in distribution systems," IET Generation, Transmission, and Distribution, The Institution of Energineering and Technology, vo., 9, No. 16, Nov. 30, 2015, pp. 2593-2601.

Milioudis et al., "Detection and ocation of high impedance faults in multiconductor overhead distribution lines using power line communication devices," IEEE Transactions on Smart Grid, vol. 6, No. 2, Nov. 12, 2014, pp. 894-902.

Niu et al., "Squared-loss Mutual Information Regularization: A Novel Information-theoretic Approach to Semi-supervised Learning," Proceedings of Machine Learning Research, vol. 28, No. 3, International Conference on Machine Learning, Jun. 17-19, 2013, Atlanta, GA, pp. 10-18.

Nunes et al., "Distribution systems high impedance fault location: A spectral domain model considering parametric error processing," Electrical Power and Energy Systems, vol. 109, Jul. 2019, 227-241.

Parikh et al., "SVR-based current zero estimation technique for controlled fault interruption in the series-compensated transmission line," IEEE Transactions on Power Delivery, vol. 28, No. 3, May 3, 2013, pp. 1364-1372.

Pignati et al., "Fault detection and faulted line identification in active distribution networks using synchrophasors-based real-time state estimation," IEEE Transaction on Power Delivery, vol. 32, No. 1, Mar. 23, 2016, pp. 381-392.

Radil et al., "Methods for Estimation of Voltage Harmonic Components," chapter 13, Power Quality, InTech, London, U.K., Apr. 2011, pp. 255-270.

Sagastabeitia et al., "Low-current fault detection in high impedance grounded distribution networks, using residual variations of asymmetries," IET Generation, Tranmission, and Distribution, The Institution of Engineering and Technolog, vol. 6, No. 12, Dec. 2012, pp. 1252-1261.

Sahoo et al., "A method to detect high impedance faults in distribution feeders," IEEE PES T&D Conference and Exposition, Apr. 14-17, 2014, Chicago, IL, 6 pages.

Sarlak et al., "High-impedance faulted branch identification using magnetic-field signature analysis," IEEE Transactions on Power Delivery, vol. 28, No. 1, Nov. 27, 2012, pp. 67-74.

Schweitzer Engineering Laboratories, Inc. "SEL-421 Relay Protection and Automation Instruction Manual Applications Handbook," Jun. 27, 2013, 372 pages.

Schweitzer Engineering Laboratories, Inc., "Arc Sense Technology (AST): High-Impedance Fault Detection," 2016, 10 pages, available online:https://cdn.selinc.com/assets/Literature/Product%20Literature/Flyers/Arc-Sense_PF00160.pdf?v=20161031-073656.

Cui et al., "Enhance High Impedance Fault Detection and Location Accuracy via μ-PMUs" IEEE Transactions on Smart Grid, vol. 11, No. 1, Jan. 2020, pp. 797-809.

Powerside "microPMU" Data Sheet, powerside.com, 2020, 2 pages.

Witten et al. "Data Mining: Practical Machine Learning Tools and Techniques" Elsevier, Second Edition, 2005, 558 pages.

Witten et al. "Data Mining: Practical Machine Learning Tools and Techniques" Elsevier, Second Edition, 2016, 642 pages.

Sedighi et al., "High impedance fault detection based on wavelet transform and statistical pattern recognition," IEEE Transaction on Power Delivery, vol. 20, No. 4, Oct. 3, 2005, pp. 2414-2421.

Sheng et al., "Decision tree-based methodology for high impedance fault detection," IEEE Transactions on Power Delivery, vol. 19, No. 2, Mar. 30, 2004, pp. 533-536.

Stewart et al., "Open μPMU: A real world reference distribution micro-phasor measurement unit data set for research and application development," LBLN-1006408, Lawrence Berkeley National Laboratory, Berkeley, CA, Oct. 2016, 4 pages.

Sultan et al., "Detection of high impedance arcing faults using a multi-layer perceptron," IEEE Transactions on Power Delivery, vol. 7, No. 4, Oct. 1992, pp. 1871-1877.

Sze et al., "Hardware for machine learning: Challenges and opportunities," IEEE Custom Integrated Circuits Conference (CICC), Apr. 30-May 3, 2017, Austin, TX, 8 pages.

Tengdin et al., "High Impedance Fault Detection Technology," Report of Power Stystem Relaynig and Control Committee Working Group D15, IEEE Power and Energy Society, Mar. 1, 1996, 12 pages.

VIZIMAX Inc., "Phasor Measurement Unit (PMU) Datasheet: PMU01000," Sep. 18, 2017, 38 pages.

Von Meier et al., "Precision micro-synchrophasors for distribution systems: A summary of applications," IEEE Transactions on Smart Grid, vol. 8, No. 6, Jun. 28, 2017, pp. 2926-2936.

Wai et al., "A novel technique for high impedance fault identification," IEEE Transactions on Power Delivery, vol. 13, No. 3, Jul. 1998, pp. 738-744.

Yu et al., "An adaptive high and low impedance fault detection method," IEEE Transactions on Power Delivery, vol. 9, No. 4, Oct. 1994, pp. 1812-1821.

Zhang et al., "Model-based general arcing fault detection in medium-voltage distribution lines," IEEE Transactions on Power Delivery, vol. 31, No. 5, Jan. 25, 2016, pp. 2231-2241.

Zhao et al., "A framework for robust hybrid state estimation with unknown measurement noise statistics," IEEE Transactions on Industrial Informatics, vol. 14, No. 5, Oct. 19, 2017, pp. 1866-1875.

Zhou et al., "Partial knowledge data-driven event detection for power distribution networks," IEEE Transactions on Smart Grid, vol. 9, No. 5, Mar. 13, 2017, pp. 5152-5162.

Zhu et al., "Automated fault location and diagnosis on electric power distribution feeders," IEEE Transactions on Power Delivery, vol. 12, No. 2, Apr. 1997, pp. 801-809.

Zhuang, D., "Real time testing of intelligent relays for synchronous distributed generation islanding detection," Master's Thesis, Department of Electrical and Computer Engineering, McGill University, Montreal, Quebec, Mar. 2012, 110 pages.

Non-Final Office Action for U.S. Appl. No. 17/337,976, dated Sep. 6, 2022, 22 pages.

\* cited by examiner

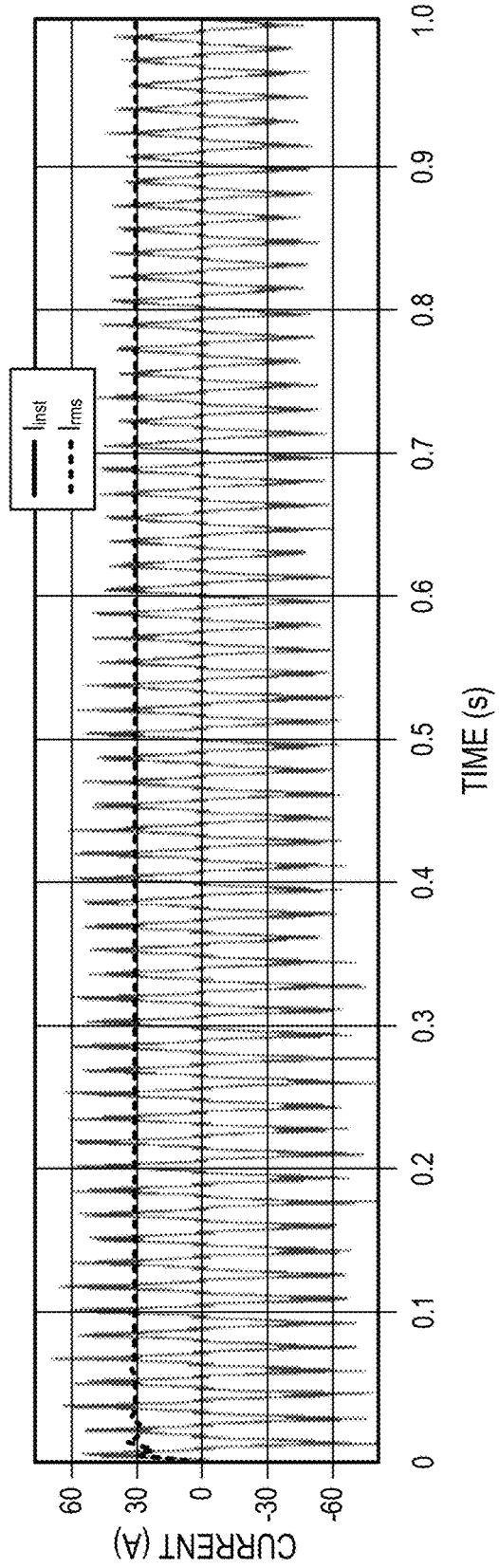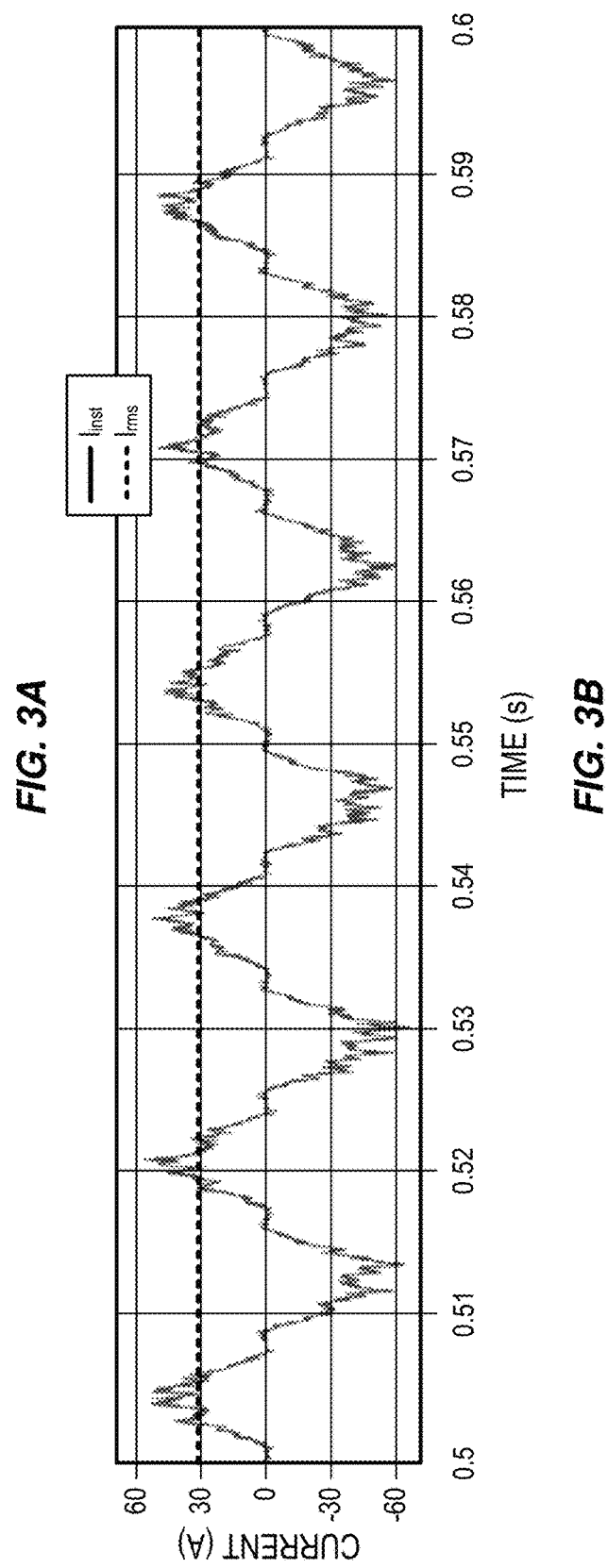
FIG. 3A
FIG. 3B

EFFECTIVE FEATURE SET-BASED HIGH IMPEDANCE FAULT DETECTION

RELATED APPLICATIONS

This application claims the benefit of provisional patent application Ser. No. 62/859,929, filed Jun. 11, 2019, the disclosure of which is hereby incorporated herein by reference in its entirety.

FIELD OF THE DISCLOSURE

The present disclosure relates to high impedance fault (HIF) detection in power distribution systems.

BACKGROUND

High impedance fault (HIF) conditions can occur in power distribution systems with voltages ranging from 4 kilovolts (kV) to 34.5 kV. Upon the occurrence of an HIF, potential danger is imposed on the immediate vicinity of the HIF, which is hazardous to public safety. Unfortunately, HIFs cannot always be recorded in a fault report to relay engineers, and reported cases are therefore less than what line crews observe from the field. One study showed that conventional protection cleared only 17.5% of staged HIFs. With renewable energy integration into distribution grids, the importance of HIF detection increases dramatically. Therefore, an effective HIF detection method is required to avoid false tripping and maintain continuity of a power supply.

Specifically, an HIF is usually associated with an undowned or downed conductor. The undowned conductor scenario involves the contacts between overhead lines and tree limbs that have large impedance. Similarly, if a downed conductor falls on a poorly conductive surface such as sand, asphalt, grass, soil, or concrete, the fault current might be too low to reach the pickups of traditional ground overcurrent relays. Typical fault currents are reported ranging from 10 to 50 amps (A), with an erratic waveform.

For decades, researchers and engineers have sought a universally effective solution to HIF detection. Initially, enhancements of conventional relays were proposed, leading to a proportional relaying algorithm, impedance-based method, and PC-based fault locating and diagnosis algorithm. However, these methods are ineffective in detecting HIFs with a low fault current. For this problem, harmonics patterns are utilized to capture HIF characteristics, such as magnitudes and angles of 3rd and 5th harmonics, even order harmonic power, and inter-harmonic currents. In addition, a Kalman-filter-based method has been proposed to monitor harmonics in HIF detection. This type of method actively injects higher than fundamental frequency signals, such as positive/zero voltage signals, into the grid to detect HIFs. Moreover, wavelet transform, genetic algorithm, and mathematical morphology have been proposed to detect HIFs.

Unfortunately, most of these attempts at addressing HIF detection issues rely on simple thresholds and logic, which lack a systematic procedure that determines the most effective features for various distribution systems and scenarios during HIFs. Therefore, it is necessary to introduce a systematic design for a learning framework, so that information gain in high-dimensional correlation can be quantified for better HIF detections.

With respect to machine learning, artificial intelligence (e.g., expert system) was proposed in the early 1990's. In subsequent years, methods using neural networks, decision trees, and fuzzy inferences were discussed. In recent years, some data processing techniques including wavelet transform and mathematical morphology have gained popularity in HIF detection. These techniques supply historical data to several machine learning algorithms (Bayes, nearest neighborhood rule, support vector machine (SVM), etc.) to differentiate fault cases.

Although the above approaches reveal the importance of machine learning in HIF detection, they only utilize a certain type of detection feature on general HIFs. However, it is unlikely for a certain category to capture all characteristics of HIFs. Rather, various physical features from multiple types of signal processing techniques should be generated to explore the HIF pattern. In addition, the important step of feature selection should not be omitted before applying any learning algorithm. Otherwise, the historical data is not utilized enough for efficient learning in HIF.

As described above, HIF detection in power distribution networks has been a challenging task. Several types of HIF models are available for HIF study, but they still do not exhibit satisfactory fault waveforms. However, recent approaches use historical data and machine learning methods to improve HIF detection. Nonetheless, most proposed methodologies address the HIF issue starting with investigating a limited group of features and can hardly provide a practical and implementable solution.

SUMMARY

Effective feature set-based high impedance fault (HIF) detection is provided. Systems, methods and devices described herein present a systematic design of power feature extraction for HIF detection and classification. For example, power features associated with HIF events are extracted according to when a fault happens, how long it lasts, and the magnitude of the fault. Complementary power expert information is also integrated into feature pools. In another aspect, a ranking procedure is deployed in a feature pool for balancing information gain and complexity in order to avoid over-fitting of features.

In aspects described herein, a logic-based HIF detector implements HIF feature extraction. To determine when an HIF occurs, the HIF detector calculates different quantities, such as active power and reactive power, based on a voltage and current time series. The HIF detector uses the derivative of these quantities to tell when there is a potential change due to HIF. To determine duration of the HIF, the HIF detector uses a discrete Fourier transform (DFT) to quantify the harmonics of the voltage and current, so that suspicious harmonics can be recorded for later inspection. To determine magnitude of the HIF, the HIF detector estimates coefficients of Kalman Filter (KF)-based harmonics. Numerical methods show the proposed HIF detector has very high dependability and security performance under multiple fault scenarios compared with traditional methods.

An exemplary embodiment provides an HIF detector. The HIF detector includes a system characteristic averager configured to store instantaneous power characteristic values and provide averaged characteristic values of the instantaneous power characteristic values. The HIF detector further includes a decision circuit configured to determine occurrence of an HIF based on the instantaneous power characteristic values and the averaged power characteristic values.

Another exemplary embodiment provides a method for detecting an HIF. The method includes receiving power measurements from a power distribution system. The method further includes extracting an angle difference between a negative sequence voltage and a zero sequence voltage ($\theta_{V_2}-\theta_{V_0}$) from the power measurements. The method further includes determining occurrence of an HIF based on the $\theta_{V_2}-\theta_{V_0}$.

Another exemplary embodiment provides a protective relay for a power distribution line. The protective relay includes a power coupler and an HIF detector coupled to the power coupler. The HIF detector includes feature extraction logic configured to extract instantaneous power characteristic values from a signal of the power coupler and a system characteristic averager configured to provide averaged power characteristic values from the instantaneous power characteristic values. The HIF detector further includes a decision circuit configured to determine occurrence of an HIF based on a comparison of the instantaneous power characteristic values with the averaged power characteristic values using a trained HIF model.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 3A is a graphical representation of instantaneous and root-mean-square (RMS) HIF current waveforms obtained using the HIF model of FIG. 1.

FIG. 3B shows the instantaneous and RMS HIF current waveforms of FIG. 3A in greater detail.

DETAILED DESCRIPTION

Figure 1:
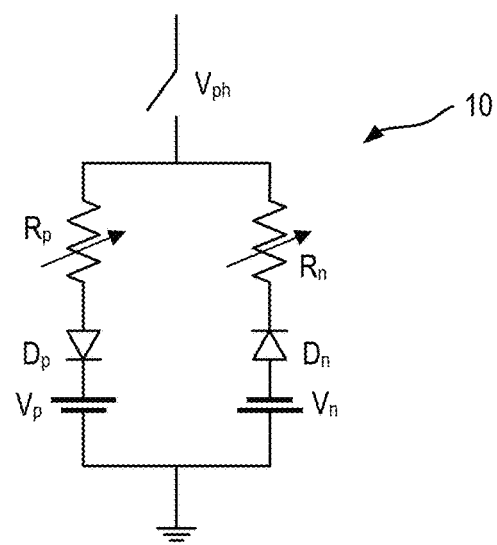
FIG. 1 is a schematic diagram of a high impedance fault (HIF) model using two anti-parallel direct current (DC) sources.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Effective feature set (EFS)-based high impedance fault (HIF) detection is provided. Systems, methods and devices described herein present a systematic design of power feature extraction for HIF detection and classification. For example, power features associated with HIF events are extracted according to when a fault happens, how long it lasts, and the magnitude of the fault. Complementary power expert information is also integrated into feature pools. In another aspect, a ranking procedure is deployed in a feature pool for balancing information gain and complexity in order to avoid over-fitting of features.

In aspects described herein, a logic-based HIF detector implements HIF feature extraction. To determine when an HIF occurs, the HIF detector calculates different quantities, such as active power and reactive power, based on a voltage and current time series. The HIF detector uses the derivative of these quantities to tell when there is a potential change due to HIF. To determine duration of the HIF, the HIF detector uses a discrete Fourier transform (DFT) to quantify the harmonics of the voltage and current, so that suspicious harmonics can be recorded for later inspection. To determine magnitude of the HIF, the HIF detector estimates coefficients of Kalman Filter (KF)-based harmonics. Numerical methods show the proposed HIF detector has very high dependability and security performance under multiple fault scenarios compared with traditional methods.

I. High Impedance Fault Modeling

FIG. 1 is a schematic diagram of an HIF model 10 using two anti-parallel direct current (DC) sources $V_p$, $V_n$. The HIF model 10 is one of several available approaches, and is included for illustrative purposes. The HIF model 10 connects one phase of a power line to ground. The HIF model 10 includes two parallel branches, each with a variable resistor $R_p$, $R_n$, a diode $D_p$, $D_n$, and a DC source $V_p$, $V_n$. The two variable resistors $R_p$, $R_n$ are both changing randomly, modeling dynamic arcing resistance. The two sets of diodes $D_p$, $D_n$ and DC sources $V_p$, $V_n$ are connected in an anti-parallel configuration. The two DC sources $V_p$, $V_n$ are randomly varying as well, which model the asymmetric nature of HIF. A positive half cycle of HIF current is achieved when $V_{ph} > V_p$, while a negative half cycle is achieved when $V_{ph} < V_n$. When $V_n < V_{ph} < V_p$, the current equals zero, which represents a period of arc extinction. In order to generate a fault current down to 10 amps (A) in a benchmark system, the model parameters in Table I are applied to the HIF model 10.

TABLE I

| Component | Value Range | Values change every |
|---|---|---|
| $V_p$ | 5~6 kV | 0.1 ms |
| $V_n$ | 7~8 kV | 0.1 ms |
| $R_p$ | 30~1500 Ω | 0.1 ms |
| $R_n$ | 30~1500 Ω | 0.1 ms |

Figure 2:
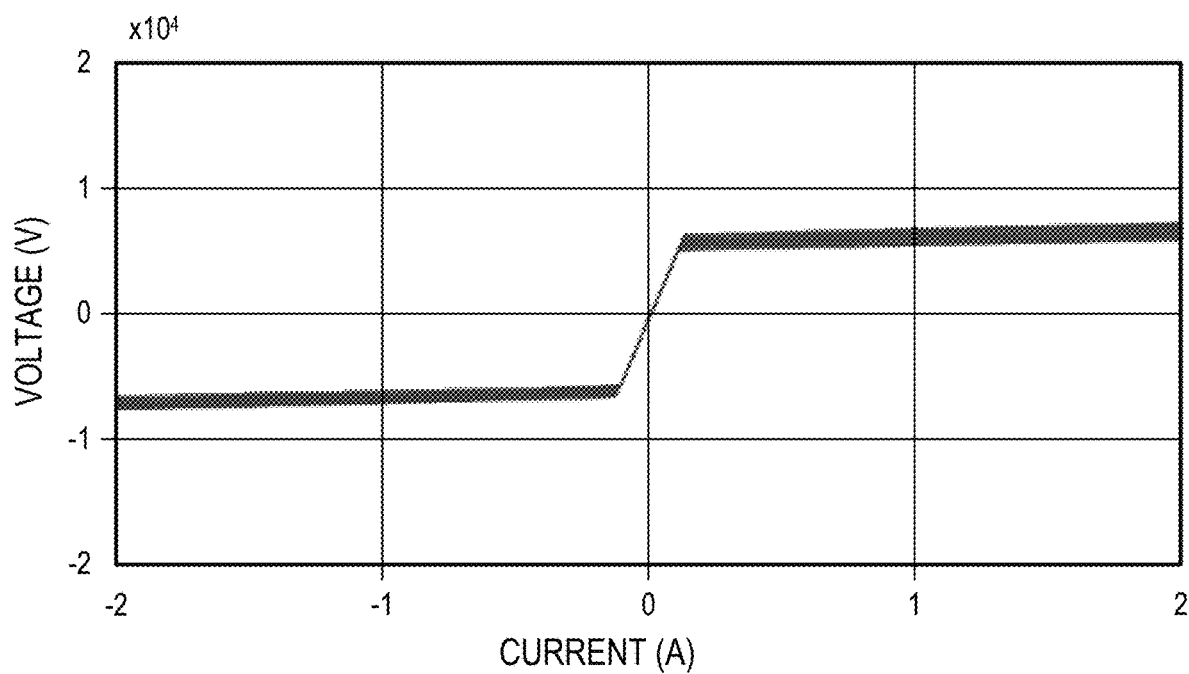
FIG. 2 is a graphical representation of a course of arc extinction around small currents obtained using the HIF model of FIG. 1.

FIG. 2 is a graphical representation of a course of arc extinction around small currents obtained using the HIF model 10 of FIG. 1. This not only highlights the capability of the HIF model 10 on arc extinction modeling, but also the asymmetric and nonlinear characteristics of the HIF.

FIG. 3A is a graphical representation of instantaneous ($I_{inst}$) and root-mean-square (RMS) ($I_{rms}$) HIF current waveforms obtained using the HIF model 10 of FIG. 1. FIG. 3B shows the instantaneous ($I_{inst}$) and RMS ($I_{rms}$) HIF current waveforms of FIG. 3A in greater detail. The HIF current waveforms display the irregular, random, asymmetric and decreasing current waveforms of the modeled HIF.

With reference to FIGS. 2, 3A, and 3B, through a harmonic decomposition of a measured HIF voltage signal, a total harmonic distortion of 0.31% is observed on the voltage signal and 24.99% is observed on the current signal in an ideal single phase circuit test. It makes sense that an HIF has a severely distorted fault current due to arcing and a not-much-compromised voltage waveform regulated by the grid. Simulation and field test results of this HIF model 10 demonstrate a good modeling performance.

II. Feature Selection Method for High Impedance Fault

Feature selection helps HIF detection identify a key feature set and reduce data amount/layers, which increases the applicability of the HIF detection approach described herein. Therefore, an approach to selecting the key features is elaborated in this section. A power distribution system which may be subject to HIF events is described, after which the variable-importance in feature evaluation is explained. The pool of features and selected features are then described, followed by a way of obtaining the feature pool data.

A. Benchmark System

Figure 4:
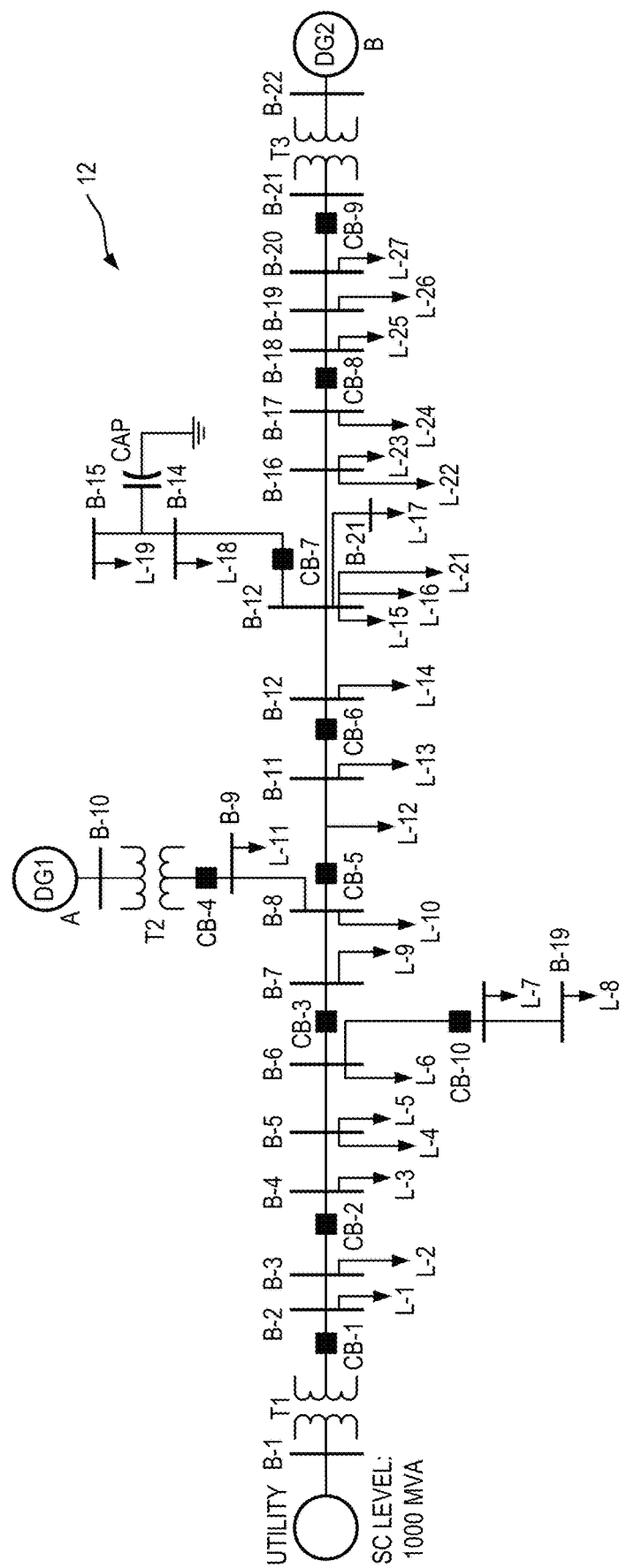
FIG. 4 is a schematic diagram of an exemplary power distribution system which may experience HIF events.

FIG. 4 is a schematic diagram of an exemplary power distribution system 12 which may experience HIF events. The power distribution system 12 may serve as a benchmark for examining the effectiveness of the HIF detection approach described herein, including the HIF detector described below with respect to FIG. 5. The configuration of the power distribution system 12 under different distributed energy resource (DER) technologies is presented in Table II (where SG refers to synchronous generator, WF refers to wind farm, and N/A refers to not available). Where a windfarm is indicated, the wind farm is type 4 and rated at 575 volts (V), 6.6 megavolt-amps (MVA). According to IEEE Standard 1547, the wind farm adopts constant power control with low voltage ride through (LVRT) capability. The maximum fault current is limited to 1.5 per-unit (pu).

TABLE II

| System Type | Location A | Location B |
|---|---|---|
| Synchronous-machine-based system | SG | N/A |
| Inverter-based system | WF | N/A |
| Hybrid system | SG | WF |

B. Variable-Importance in Feature Evaluation

A decision-tree-based algorithm in machine learning provides protection engineers with optimal relay logic and settings in distribution network protection. However, locating the key features of HIF is a significant challenge, given its randomness and irregularity. In other words, an effective and unbiased feature evaluator is required to calculate the merit of each tested feature before the classification between HIF event and non-HIF event. Embodiments described herein take advantage of an information gain and minimum description length (MDL)-based discretization algorithm to select important features during HIF.

The MDL-based method relies on information gain (also referred to as entropy). Once the information gain of each feature is calculated for a classification variable, those features that contribute more information will have a higher information gain value over others, whereas those that do not add much information will have a lower score and can be removed.

The score of variable-importance is one type of selection measure in machine learning. The problem of selecting the best attribute can be stated as the problem of selecting the most compressive attribute. Assuming that all features are discrete, the objective is to find the best features that maximize the selection measure. Given C classes, the MDL can be defined as follows using the logarithm of all possible combinations of class labels:

$$MDL = \frac{1}{n_{..}} \left( \left( \begin{array}{c} n_{..} \\ n_{1.}, \ldots, n_{C.} \end{array} \right) - \sum_j \log \left( \begin{array}{c} n_{.j} \\ n_{1j}, \ldots, n_{Cj} \end{array} \right) + \log \left( \begin{array}{c} n_{..} + C - 1 \\ C - 1 \end{array} \right) - \sum_j \log \left( \begin{array}{c} n_{.j} + C - 1 \\ C - 1 \end{array} \right) \right)$$

Equation 1 in which $n_{..}$ denotes the number of training instances and $n_{i.}$ is the number of training instances from class $C_i$, $n_{.j}$ is the number of instances with the j-th value of the given attribute, and $n_{ij}$ is the number of instances from class $C_i$ and with the j-th value of the given attribute. More details regarding how the variable-importance approach has been used in the feature evaluation for the HIF detection can be found in Section V.

C. The Pool of Candidate Features

An exemplary pool of candidate features for use in HIF detection is illustrated below in Table III. The feature pool in Table III is designed in four steps. First, time series data of voltage and current is obtained with a DFT-based technique. Second, the feature pool is greatly expanded with multiple physical quantities through calculation using the times series data. These calculated measurements range from basic values (e.g., df, frequency) to first order derivatives (e.g., df/dt, the rate of change of frequency), considering both the absolute value and its changing rate. Third, the harmonic coefficients are estimated through a KF-based technique, presenting the in-phase and in-quadrature components (e.g., KF|sin H1). Finally, in order to capture some unconventional phenomena, some features are invented in the category of "other feature." For example, $\theta_{V2}-\theta_{V0}$, the angle difference between the negative and zero sequence voltage, is a good indicator of the unbalance level in distribution grids. Note that harmonic phase angles are in harmonic degrees and are the phase difference between the zero crossing of the fundamental frequency reference and the next zero crossing in the same direction of the harmonic.

TABLE III

| Feature Type | Designed Feature | Other Feature |
|---|---|---|
| DFT-based | df, df/dt, P, dP/dt, pf, dpf/dt, Q, dQ/dt, ϕ, dϕ/dt, $H_{V1}$~$H_{V6}$, $H_{I1}$~$H_{I6}$, $V_{abc}$, $V_{012}$, $I_{abc}$, $I_{012}$, dI/dt, dV/dt, $V_{ph}$, $V_{ll}$, $\theta_{V012}$, $\theta_{I012}$, $\theta_{H_{V1\_012}}$, $\theta_{H_{I1\_012}}$ | df/dP, df/dQ, dV/dP, dV/dQ, $dH_{V1}$/dt, $dH_{I1}$/dt, $\theta_{V2} - \theta_{V0}$, $\theta_{I2} - \theta_{I0}$ |
| KF-based | $KF_I$ cos $H_{I1}$~$H_{I6}$, $KF_I$ sin $H_{I1}$~$H_{I6}$, $KF_V$ cos $H_{V1}$~$H_{V6}$, $KF_V$ sin $H_{V1}$~$H_{V6}$ | $KF_V$DC |

Embodiments disclosed herein can include a number of important and implementable features, and may attempt to maximize the number of candidate features. For instance, the parameters of "when" a HIF occurs, such as the rate of change of active power (dP/dt), form a certain group of features in the feature pool. It may not matter if some non-HIF cases, such as capacitor bank switching, lead to similar changes since these cases only trigger certain features but not all features together in the proposed feature set or any well-trained statistical machine learning model. The reason for such choice is the adopted machine learning model might be so complicated that it needs the assistance of the "when" feature group at different thresholds for decision-making.

D. Events for Feature Selection

Returning in greater detail to FIG. 4, embodiments of the HIF detection technique can identify several event categories, as illustrated in Table IV. The feature selection technique described above is transferable on different feeders because the event category and event type in Table IV are suitable for most of the distribution feeders during machine training.

TABLE IV

| Event Category | Event Type | Number of Events |
|---|---|---|
| System Operating Condition | Loading Condition (30%-100%) | 8 |
| | DER Tech. (SG, inverter, hybrid) | 3 |
| Fault Event | Type 1: SLG, LLG, LL, LLLG | 10 |
| | Type 2: Downed conductor | 3 |
| | Fault impedance | 6 |
| | Inceptioin Angle (0°, 30°, 60°, 90°) | 4 |
| | Fault location | 3 |
| Non-fault Event | Normal State | 1 |
| | Load Switching | 6 |
| | Capacitor Switching | 2 |

The 10 events from Type 1 in Table IV are associated with the undowned conductor, where 3 single-line-to-ground (SLG) (AG, BG, CG), 3 line-to-line-to-ground (LLG) (ABG, ACG, BCG), 3 line-to-line (LL) (Aft BC, AC), and 1 three-line-to-ground (LLLG) (ABCG) faults are included. The 3 events of Type 2 fault are the downed conductor for each phase. The fault impedance values include 50, 150, 250, 350, 450, and 550 ohms (Ω) for illustrative purposes, though other values may be used. In load switching, the 6 types of non-fault events include 4 single load switching (L-4, L-9, L-19, L-23) and 2 combinational load switching ((L-2, L-4, L-5) and (L-9, L-10)) events. The system loading for the normal state is shown in Table V. The 2 capacitor switching events have both the on and off status of the capacitor bank near bus B-15.

TABLE V

| Phase | Active power (kW) | Reactive power (kVar) |
|---|---|---|
| A | 3,297 | 745 |
| B | 3,052 | 671 |
| C | 4,425 | 987 |
| Total | 10,774 | 2,403 |

Moreover, the event category is flexible and can be tailored for other special systems by adding or deleting some of the event categories/types. In an exemplary aspect, comprehensive scenarios are considered in the event category (refer to Table IV). A loading condition ranging from 30% to 100%, in a step of 10%, is simulated. Furthermore, eight loading conditions and three distributed generation (DG) technologies are examined respectively on top of the base case scenario. Therefore, the number of fault and non-fault events are calculated as follows:

Fault event: since two types of fault, summing up to 13 cases, are included, the number of fault events with one fault impedance, one fault inception angle, and one fault location (given the 8 loading conditions and 3 DG technologies) is (10+3)×8×3=312. Given 6 simulated fault impedances, 4 fault inception angles, and 3 fault locations, the total number of fault events adds up to 312×6×4×3=22464.

Non-fault event: it comprises normal state, load switching (adding and shedding) and capacitor switching events. Therefore the total number of non-fault events equals to (1+6+2)×8×3=216.

The above event number results in an imbalanced dataset, where the number of data points belonging to the minority class ("non-fault") is far smaller than the number of the data points belonging to the majority class ("fault"). Under this circumstance, an algorithm gets insufficient information about the minority class to make an accurate prediction. Therefore, the synthetic minority over-sampling technique (SMOTE) is employed to generate synthetic samples and shift the classifier learning bias towards the minority class.

In some examples, the HIF detection technique includes spatial data by implementing current and voltage transformers and measurement devices at a substation and downstream of the feeder. Knowledge extracted from these measurements is able to serve data from the spatial dimension for better detection coverage. Moreover, the proposed HIF detector can be installed along the distribution feeder and may be supplementary to the devices installed near the substation. This can address signal sensitivity and accuracy issues, since the further an HIF event is from the substation, the lower the signal magnitude becomes if the HIF detector were installed near the substation.

E. Effective Feature Set

Table VI presents an exemplary effective feature set (EFS) for HIF detection in three types of distribution systems. The EFS in Table VI was produced after mining the collected data, applying the feature ranking algorithm and selecting the EFS by considering the comprehensive performance in different distribution systems in Table II. The cut-off point was determined through a simple descending search process in the variable-importance list. A trade-off is realized between the detection performance improvement and the complexity of the detection logic.

TABLE VI

| Fault Type | Proposed Feature |
|---|---|
| SLG, LL, LLG | $V_2, I_2, \theta_{V_2} - \theta_{V_0}, \theta_{I_2} - \theta_{I_0}$ $KF_V \cos H_{V3}, KF_V \sin H_{V3}$ |
| LLLG | $V_{ll}, V_{ph}, H_{V1}, \theta_{H_{V1}}$ $KF_I \cos H_{I1}, KF_I \sin H_{I1}$ |

The search process for the EFS began with testing the first feature that has the highest score, then the first two features with the highest scores, then the first three features, and so on. Then two stopping criteria were set: (1) the incremental of detection accuracy (A, defined in Section VI) of two adjacent tests is larger than 0.1%, and (2) the number of features is smaller than a practical number N (N=15 is used for illustrative purposes herein). Extensive tests showed that the increase of the performance indices becomes marginal when the variable-importance threshold is selected at 0.787. Meanwhile, the complexity of the detection logic and the number of signals are within an acceptable level (6 signals ignoring phases, three categories, suitable for unbalanced faults as shown in Table VI).

According to the mathematical formulation and physical interpretation described above, these features are used for fault detection because: (1) some physical quantities are statistically more relative to the classification results than others, and (2) based on the merit of each feature, the features in Table IV contribute more information gain than others. For example, $\theta_{V_2}-\theta_{V_0}$, the angle difference between the negative and zero sequence voltage, is selected since it captures the incremental of the unbalance level contributed from HIFs to distribution grids. The use of the angle difference between zero and negative sequence voltage is inspired by previous work and practical engineering experience. While this feature is used in some other fault detection applications, it has not been used in HIF detection before.

III. High Impedance Fault Detector

Figure 5:
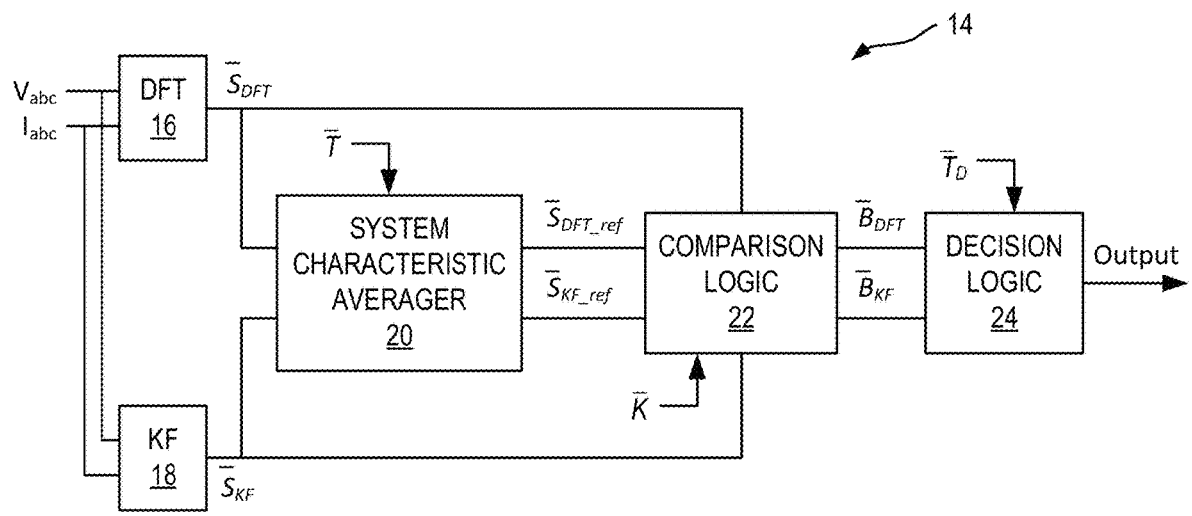
FIG. 5 is a schematic diagram of an exemplary HIF detector implemented in a logic circuit.

FIG. 5 is a schematic diagram of an exemplary HIF detector 14 implemented in a logic circuit. In an exemplary aspect, the HIF detector 14 is implemented in a microprocessor-based digital relay (e.g., a protective relay for a power distribution line, which may be located at CB-1~CB-10 in the power distribution system 12 of FIG. 4), which can facilitate the feature selection techniques discussed above with respect to FIG. 4. Similar to conventional digital relays, the proposed relay logic takes the voltage and current signals ($V_{abc}$, $I_{abc}$) as its input (e.g., from a power coupler, not shown). In addition, a DFT circuit 16 and KF circuit 18 are required for corresponding feature extraction. The HIF detector 14 includes a system characteristic averager 20, comparison logic 22 (e.g., a comparison circuit), and decision logic 24 (e.g., a decision circuit) for analyzing power characteristic values (e.g., the EFS) and determining occurrence of an HIF.

Generally, the proposed HIF detection scheme of the HIF detector 14 updates its comparison logic 22 and decision logic 24 according to the obtained decision tree structure. As indicated in FIG. 5, detection logic (e.g., a power coupler and/or logic coupled to the power coupler) sends three-phase voltage and current signals ($V_{abc}$, $I_{abc}$) to the DFT circuit 16 and the KF circuit 18 for feature extraction. The HIF detector 14 can implement the EFS described above in Section II-E as an example. Equations 2 and 3 show the extracted instantaneous signals after the DFT circuit 16 and KF circuit 18:

$$\bar{S}_{DFT}=\{s_1,s_2,s_3,s_4\}=\{V_2,I_2,\theta_{V_2}-\theta_{V_0},\theta_{I_2}-\theta_{I_0}\} \quad \text{Equation 2}$$

$$\bar{S}_{KF}=\{s_5,s_6,s_7,s_8,s_9,s_{10}\}=\{KF_{V_a}\cos H_{V3}, KF_{V_b}\cos H_{V3}, KF_{V_c}\cos H_{V3}, KF_{V_a}\sin H_{V3}, KF_{V_b}\sin H_{V3}, KF_{V_c}\sin H_{V3}\} \quad \text{Equation 3}$$

The HIF detector 14 of FIG. 5 is implemented by relating the EFS and the detection logic using simple thresholds, similar to many traditional detectors. Statistically, since three-phase faults take up only 2%-3% of the fault occurrences, the HIF detector is described in this regard for unbalanced HIF only. It should be understood that a three-phase implementation is also within the scope of the present disclosure.

A. System Characteristic Averager

The input of the system characteristic averager 20 includes the extracted instantaneous signals (e.g., instantaneous power characteristic values) after the DFT and KF circuits 16, 18. Meanwhile, the time duration $\bar{T}$ needs to be provided to the system characteristic averager 20. Specifically, the system characteristic averager 20 has a memory that stores the signals for a predefined duration of $\bar{T}=\{t_1, t_2, t_3, t_4, t_5, t_6, t_7, t_8, t_9, t_{10}\}$. In other words, $\bar{T}$ is a time constant that is a vector of ten elements associated with the DFT signal $\bar{S}_{DFT}$ and the KF signal $\bar{S}_{KF}$. The input signals are stored and calculated at every 18,000 cycles (e.g., 5 minutes).

After each batch of average value calculation, the system will automatically overwrite the earliest records once the storage capacity has been reached. The five minutes interval is subject to change depending on the case-specific analysis.

Normally, the five-minute data is feasible for the distribution system condition evaluation and for modern digital relay implementation. For example, the HIF solution by SEL Inc. also deploys a memory function to record unusual signal changes related to system HIF. In-depth simulation or experimental results can be conducted to validate the effectiveness of this time constant over a large time scale. In the end, each time constant is either increased or decreased depending on the signal's slow or fast dynamic process.

To avoid signal spikes, a limiter is implemented at the beginning of each signal channel. Meanwhile, the time constant $\overline{T}$ is set according to the system characteristics of each individual signal. A small $t_i$ (i=1, 2, ..., 10) can avoid severe step change of signal but a large $t_i$ costs more data storage and computational efforts. The output of the system characteristic averager 20 generates the reference value $S_{i\_ref}$ (i=1, 2, ..., 10) for the comparison logic 22 (e.g., averaged power characteristic values). A reliable average value is a prerequisite to successful detection.

B. Comparison Logic

Figure 6:
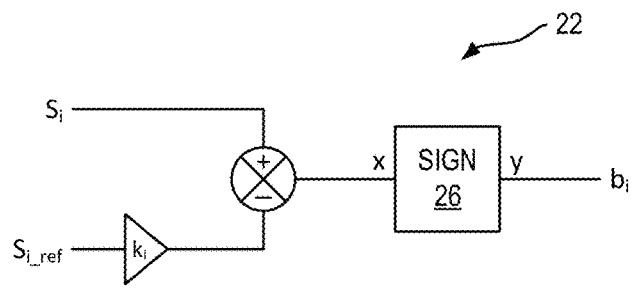
FIG. 6 is a schematic diagram showing details of the comparison logic in the HIF detector of FIG. 5.

FIG. 6 is a schematic diagram showing details of the comparison logic 22 (e.g., the comparison circuit) in the HIF detector 14 of FIG. 5. Based on the feature extraction technique discussed above with respect to FIG. 4, the extracted instantaneous signal $s_i$ can be understood as the system background signal superimposed by the extra signal contributed from the HIF behavior. The comparison is therefore made between the extracted instantaneous signal $s_i$ (e.g., one or more instantaneous power characteristic values) and its reference value $s_{i\_ref}$ (e.g., one or more averaged power characteristic values).

The sensitivity gain of $k_i$ is incorporated in order to 1) set the margin of detection and 2) add a handle to the detection sensitivity. Where the undefined parameter of $\overline{K}$ stands for:

$$\overline{K}=\{k_1,k_2,k_3,k_4,k_5,k_6,k_7,k_8,k_9,k_{10}\}$$ Equation 4

The sensitivity gain $\overline{K}$ is set at 1.2 (adjustable for each element). The 20% above and below margin is adjustable and is taken as typical blackout region where the HIF tripping is not required. This $k_i$ value can be set to close to 1.0 after getting more confidence in HIF detection scheme. After the summation block in FIG. 6, a Sign function 26 is employed to provide the following decision making:

When x>0, y=1;

When x≤0, y=0.

The output of the comparison logic 22 is the comparison assertion bit of $b_i$ (i=1, 2, ..., 10), the $\overline{B}$ (e.g., one or more comparison values), which is the input to the decision logic 24 of FIG. 5.

C. Decision Logic

Figure 7:
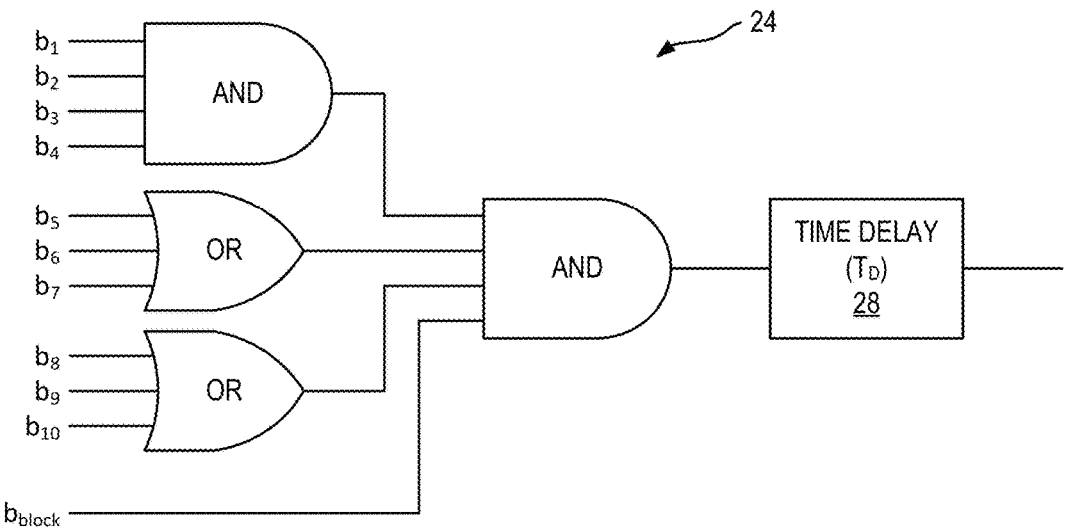
FIG. 7 is a schematic diagram showing details of the decision logic in the HIF detector of FIG. 5.

FIG. 7 is a schematic diagram showing details of the decision logic 24 (e.g., the decision circuit) in the HIF detector 14 of FIG. 5. The comparison assertion bit of $b_i$ (i=1, 2, ..., 10) is the output of the comparison logic 22 in FIG. 6. The decision logic 24 in FIG. 7 is the execution part of the HIF detector 14. There are four groups of signal bits:

1) DFT-based assertion bits ($b_1$, $b_2$, $b_3$, $b_4$). The four bits go through an AND gate. If any of the four signals are not asserted, the decision logic 24 will not be set high.

2) KF-estimated in-phase components of third harmonic voltage ($b_5$, $b_6$, $b_7$). If none of the three-phase in-phase components of third harmonic estimated from the KF gets asserted, the decision logic 24 will not be set high.

3) KF-estimated in-quadrature components of harmonic voltage ($b_8$, $b_9$, $b_{10}$). If none of the three-phase in-quadrature components of third harmonic estimated from the KF gets asserted, the decision logic 24 will not be set high.

4) The blocking bit $b_{block}$. If this bit is 1, the detection logic is blocked and none of the HIF events can be detected; if this bit is 0, HIF detection is enabled.

A time delay 28 of $T_D$ is implemented because an appropriate selection of $T_D$ can effectively avoid the false operation resulting from normal switching, which sometimes contributes to third harmonics. The output of the HIF detector 14 is either alarming or tripping signal.

D. Performance Test of the HIF Detector

With reference to FIGS. 4 and 5, the proposed HIF detector 14 has been tested as follows.

Testing Environment:

The HIF detector 14 was tested under 7884 new scenarios: 7776 unbalanced faults and 108 non-faults. The fault locations under testing include faults near B-3, B-11, and B-19 of the power distribution system 12 of FIG. 4. The measurement point was at the substation. Its sampling frequency was 2000 Hz. The time delay in the decision logic 24 of FIG. 7 was set to 100 ms. The average fault detection time was 0.126 sec using OPAL-RT real-time simulator. The signals measured were the three-phase voltage and current. The features used were derived from the measured signals and can be found in the EFS in the unbalanced fault row of Table IV.

Testing Criteria:

In order to compare the proposed technique with some existing ones in the field, adopted criteria include accuracy (A), dependability (D), security (S), speed (V), objectivity (OBJ), and completeness (COM). The detailed definition of these evaluation criteria is shown in Section VI. The performance of the proposed method was compared with four representative HIF detection methods: 1) D. C. Yu and S. H. Khan, "An adaptive high and low impedance fault detection method," *Power Delivery, IEEE Transactions on*, vol. 9, no. 4, pp. 1812-1821, 1994 (hereinafter "Yu"); 2) A.-R. Sedighi, M.-R. Haghifam, O. Malik, and M.-H. Ghassemian, "High impedance fault detection based on wavelet transform and statistical pattern recognition," *Power Delivery, IEEE Transactions on*, vol. 20, no. 4, pp. 2414-2421, 2005 (hereinafter "Sedhighi"); 3) A. Ghaderi, H. A. Mohammadpour, H. L. Ginn, and Y.-J. Shin, "High-impedance fault detection in the distribution network using the time-frequency-based algorithm," *Power Delivery, IEEE Transactions on*, vol. 30, no. 3, pp. 1260-1268, 2015 (hereinafter "Ghaderi"); 4) S. Sahoo and M. E. Baran, "A method to detect high impedance faults in distribution feeders," in *T&D Conference and Exposition, 2014 IEEE PES*, IEEE, 2014, pp. 1-6 (hereinafter "Sahoo"); as well as the combined conventional relay elements (including frequency, over/under voltage, over current) in Table VII. The methods in the comparison group cover the logic-gate based HIF detector 14 of FIG. 5, wavelet domain analysis, time-frequency domain analysis, and pattern recognition techniques.

TABLE VII

| Solution under test | A (%) | D (%) | S (%) | V | OBJ | COM |
|---|---|---|---|---|---|---|
| HIF Detector (with EFS) | 97.0 | 98.3 | 95.7 | 0.13 | No | Yes |
| Yu | N/A | 69.0 | 90.7 | N/A | No | Yes |
| Sedhighi | 96 | 90 | 100 | 0.25 | No | No |
| Ghaderi | 93.6 | 100 | 81.5 | 1.00 | Yes | Yes |

TABLE VII-continued

| Solution under test | A (%) | D (%) | S (%) | V | OBJ | COM |
|---|---|---|---|---|---|---|
| Sahoo | 94.9 | 90.0 | 90.9 | 0.11 | No | Yes |
| Combined conventional relay elements | 49.1 | 0.0 | 98.2 | N/A | Yes | Yes |

Performance Comparison:

Comparing with the other five methods in Table VII, it is indicated that the proposed method has a superior overall performance in terms of the six evaluation criteria. For example, the detection accuracy of the proposed method is the highest among the solutions under test; its detection speed (1/60/0.126=0.13, according to Section VI) is not the fastest but fits well in the HIF detector 14 requirements on response time. The detection time of less than 1 second, which means the minimum speed of 0.017 in a 60 Hz network, is viewed as a conservative setting.

Security Performance Under Inrush Currents:

Inrush currents resulting from transformer energization and motor starting are investigated in this subsection. The power distribution system 12 in FIG. 4 was modified by integrating a three-phase 500 kVA transformer at L-2, as well as three 500 hp induction motors (the stator windings in delta configuration) at L-3, L-10, L-24. Consequently, aligned with Table IV, the number of transformer energization events is 4×8×3=96 (four inception angles 0°, 45°, 90°, 135°, eight loading conditions, and three system configurations); the number of motor starting events is 3×8×3=72 (three event locations, eight loading conditions, and three system configurations). Table VIII demonstrates the security index under these two types of events. Based on the results, the proposed technique has very high security performance and therefore can effectively avoid false tripping under inrush currents.

TABLE VIII

| Non-fault Event Type | Number of Events | S (%) |
|---|---|---|
| Transformer energization | 96 | 100 |
| Motor stating | 72 | 100 |

Noise Immunity Capability:

Environmental noise can potentially cause false tripping for the HIF detection techniques. The performance of the HIF detector 14 of FIG. 5 under white noise conditions of 5, 10, and 20 dB was tested. The test is similar to the Out-of-Band test defined in IEEE Standard C37.118.1 for PMUs. The testing scenarios described above were repeated with the three types of noise conditions added on the measurement.

The obtained results under these conditions closely match those in Table VII. The proposed technique is designed to be immune to noise for the following reasons. First, the signal processing techniques in both the DFT circuit 16 and the KF circuit 18 in FIG. 5 are equipped with band-pass filters that pass frequencies within a certain range and suppress noise occurring beyond the filters' bandwidth. Second, as discussed above with respect to FIG. 5, the system characteristic averager 20 is implemented with a limiter for each signal channel to avoid signal spikes. The proper selection of the time constant T can also help mitigate this issue.

Third, both the proposed detection logic and the machine learning model to be tested in the next section are immunized to the noise by itself because they are statistically reliable and the spikes whether from noise or from derivatives cannot trigger the whole detection logic or the machine learning model. Fourth, since the high frequency noise is typically very short (few cycles), the time delay that is implemented in the decision logic 24 of FIG. 7 can help distinguish high frequency noise from HIFs. In sum, if a certain environmental situation is able to compromise security, the aforementioned points should be satisfied simultaneously.

E. Method for Detecting High Impedance Fault

Figure 8:
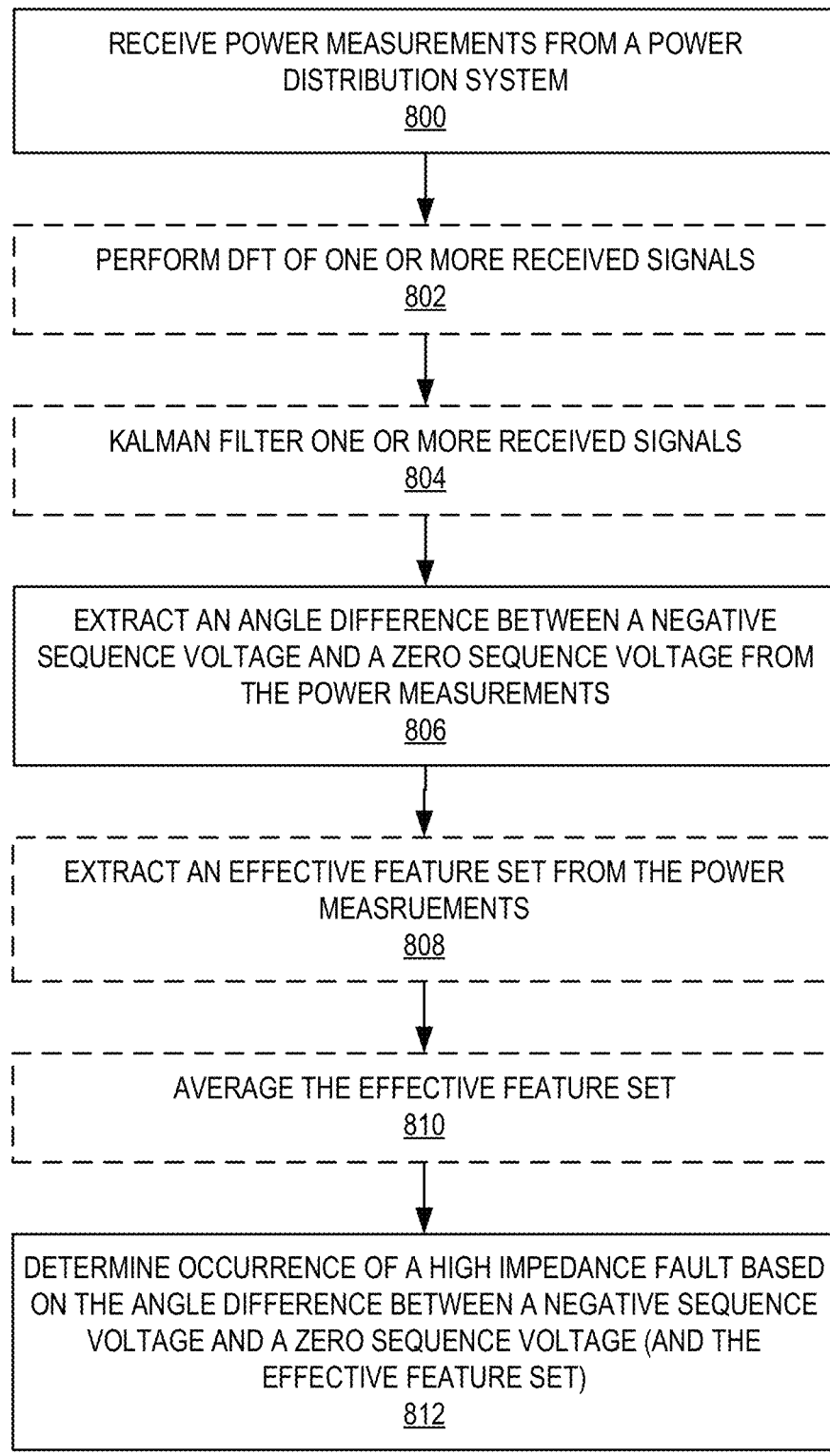
FIG. 8 is a flow diagram illustrating a process for detecting an HIF, which may be implemented by the HIF detector or another appropriate processing device.

FIG. 8 is a flow diagram illustrating a process for detecting an HIF, which may be implemented by the HIF detector 14 or another appropriate processing device (e.g., a microprocessor, field programmable gate array (FPGA), digital signal processor (DSP), application-specific integrated circuit (ASIC), or other programmable logic device, discrete gate or transistor logic, discrete hardware components, or any combination thereof). Dashed boxes represent optional steps.

The process begins at operation 800, with receiving power measurements from a power distribution system. The process optionally continues at operation 802, with performing a DFT of one or more received signals (e.g., a received voltage signal and/or current signal). The process optionally continues at operation 804, with Kalman filtering the one or more received signals (e.g., the received voltage signal and/or the received current signal).

The process continues at operation 806, with extracting an angle difference between a negative sequence voltage and a zero sequence voltage ($\theta_{V_2}-\theta_{V_0}$) from the power measurements. The process optionally continues at operation 808, with extracting an EFS comprising the $\theta_{V_2}-\theta_{V_0}$ and at least one of the negative sequence voltage ($V_2$), a negative sequence current ($I_2$), an angle difference between the negative sequence current and a zero sequence current ($\theta_{I_2}-\theta_{V_0}$), or a harmonic of a received voltage signal ($KF_V \cos H_{V3}$ or $KF_V \sin H_{V3}$). The process optionally continues at operation 810, with averaging the EFS. The process continues at operation 812, with determining occurrence of an HIF based on the $\theta_{V_2}-\theta_{V_0}$ (optionally based on the EFS).

Although the operations of FIG. 8 are illustrated in a series, this is for illustrative purposes and the operations are not necessarily order dependent. Some operations may be performed in a different order than that presented. Further, processes within the scope of this disclosure may include fewer or more steps than those illustrated in FIG. 8.

IV. Performance Analysis

Performance analysis includes the most commonly occurring single-line-to-ground-fault, the fault scenario analysis, and the testing results.

A. Single-Line-to-Ground Fault Analysis

Figure 9:
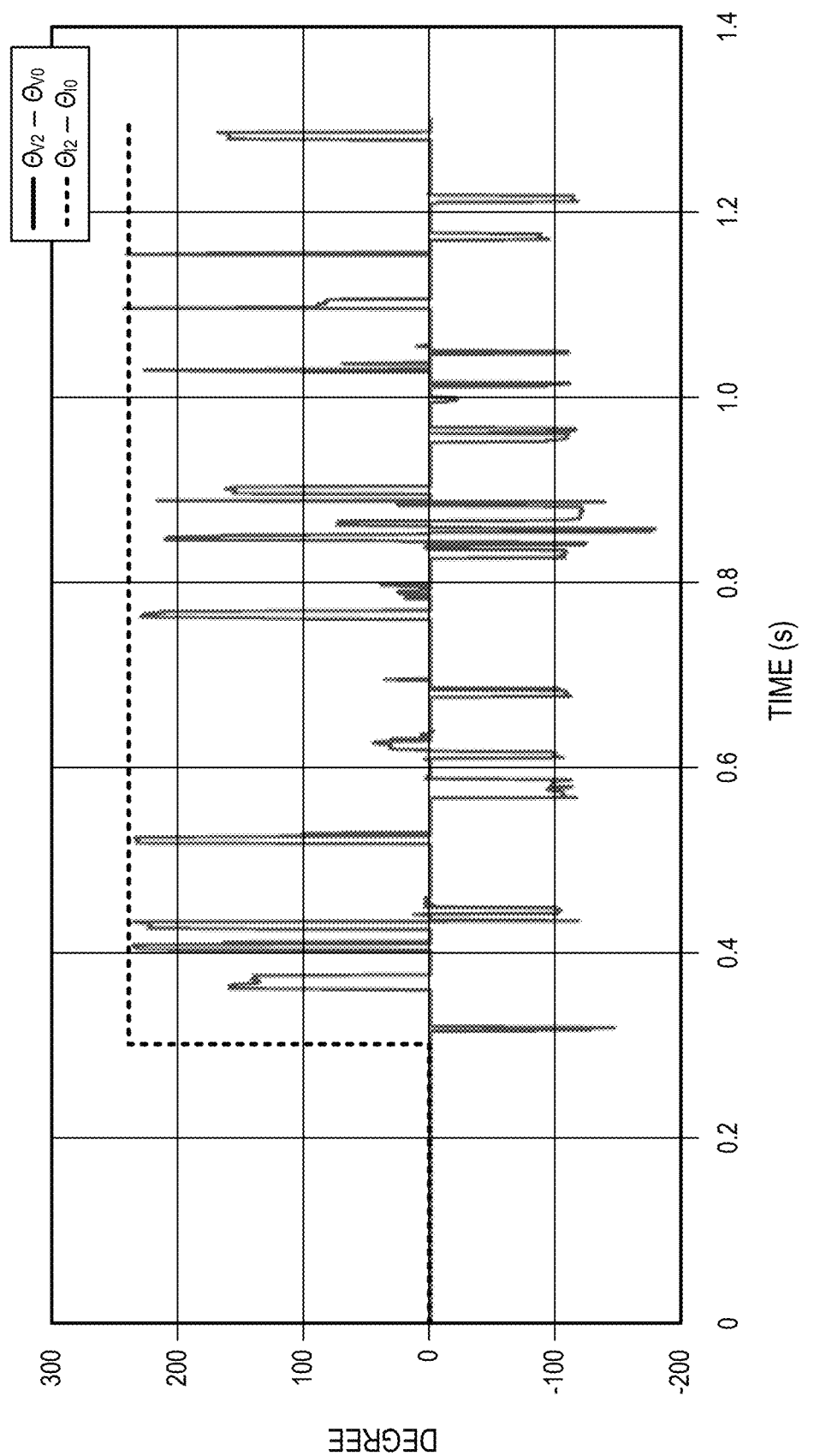
FIG. 9 is a graphical representation of exemplary waveforms of the proposed effective feature set (EFS) upon single-line-to-ground (SLG) fault.

FIG. 9 is a graphical representation of exemplary waveforms of the proposed EFS upon single-line-to-ground fault. A single-line-to-ground HIF is applied in a hybrid distributed generation system (such as described above with respect to FIG. 4) when t=0.3 second.

B. Fault Scenario Analysis

The EFS has been evaluated in terms of different fault impedances, fault inception angles, and fault locations. The quantifier for evaluation is the variable of importance explained above in Section II-B.

Figure 10B:
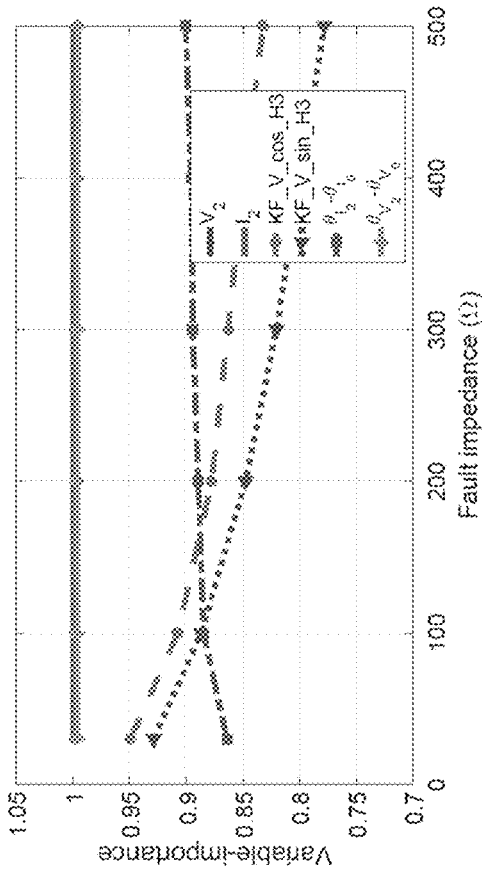
FIG. 10B is a graphical representation of variable-importance evaluations of all features under a line-to-line (LL) fault in a grounded system.
Figure 10D:
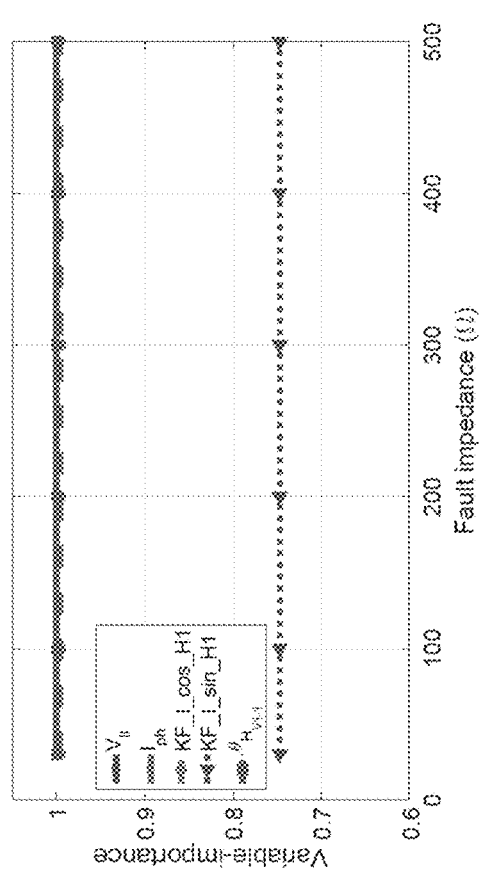
FIG. 10D is a graphical representation of variable-importance evaluations of all features under a three-line-to-ground (LLLG) fault in a grounded system.
Figure 10A:
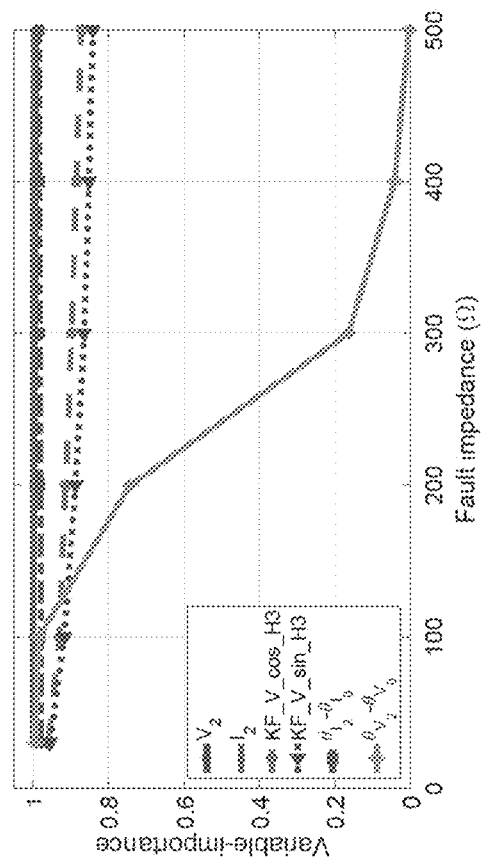
FIG. 10A is a graphical representation of variable-importance evaluations of all features under a SLG fault in a grounded system.
Figure 10C:
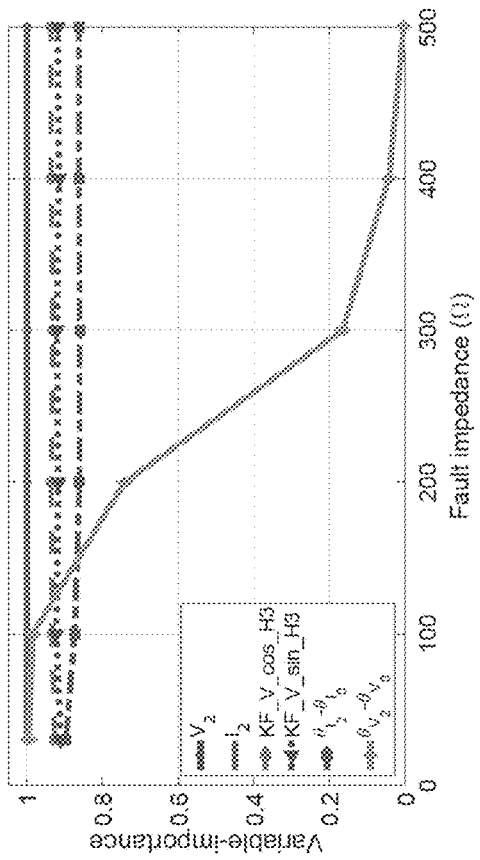
FIG. 10C is a graphical representation of variable-importance evaluations of all features under a line-to-line-to-ground (LLG) fault in a grounded system.

FIG. 10A is a graphical representation of variable-importance evaluations of all features under a single-line-to-ground (SLG) fault in a grounded system. FIG. 10B is a graphical representation of variable-importance evaluations of all features under a line-to-line (LL) fault in a grounded system. FIG. 10C is a graphical representation of variable-importance evaluations of all features under a line-to-line-to-ground (LLG) fault in a grounded system. FIG. 10D is a graphical representation of variable-importance evaluations of all features under a three-line-to-ground (LLLG) fault in a grounded system.

Fault Impedance:

To be practical, a fault impedance up to 500Ω was evaluated to cover typical HIFs whose fault currents are as low as 10 A. The variable-importance performances of each feature in EFS upon SLG fault, LL fault, LLG fault, and LLLG fault are all depicted. It is concluded that:

- The negative sequence of voltage and current are the most reliable features that can keep unaffected during any unbalanced fault upon a varying fault impedance (see FIG. 10A, wherein the line for $V_2$ is covered by other lines with the value of 1).
- The feature of the angle difference between negative sequence voltage and zero sequence voltage is reliable under LL faults but vulnerable to high fault impedance under SLG and LLG faults (see FIGS. 10A-10D).
- The third harmonic components estimated from KF deteriorate when the fault impedance increases under SLG and LL faults (see FIGS. 10A and 10B).
- The proposed three-phase HIF detection features all perform very well except for the fundamental in-quadrature component of current estimated from KF under LLLG faults (see FIG. 10D).

Furthermore, the proposed algorithm is applicable to unbalanced power systems. Since the employed feature selection method is based on the information gain, what is captured by the information gain is the incremental or variation of the negative sequence signal. Only when the variation pattern of the negative sequence feature contributes to the information gain given the output label belongs to the HIF, does this feature get selected by the proposed algorithm. As a result, the proposed method is applicable to an already unbalanced system.

Figure 11A:
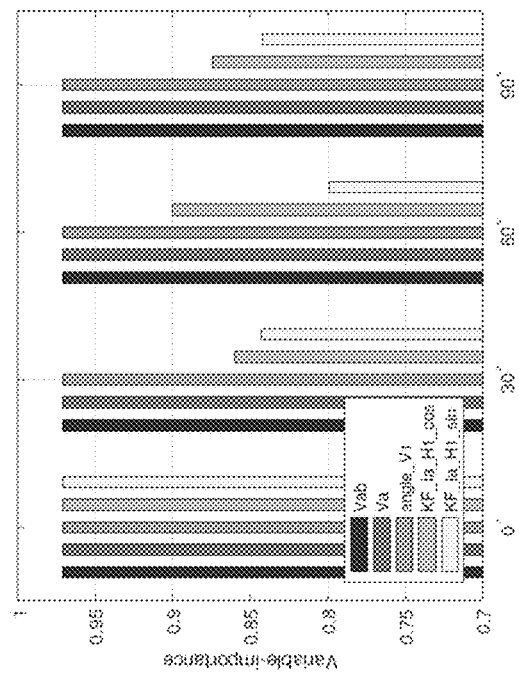
FIG. 11A is a graphical representation of variable-importance of a third harmonic of the received voltage signal ($KF_{V_a} \cos H3$) at different fault inception angles and fault types.
Figure 11B:
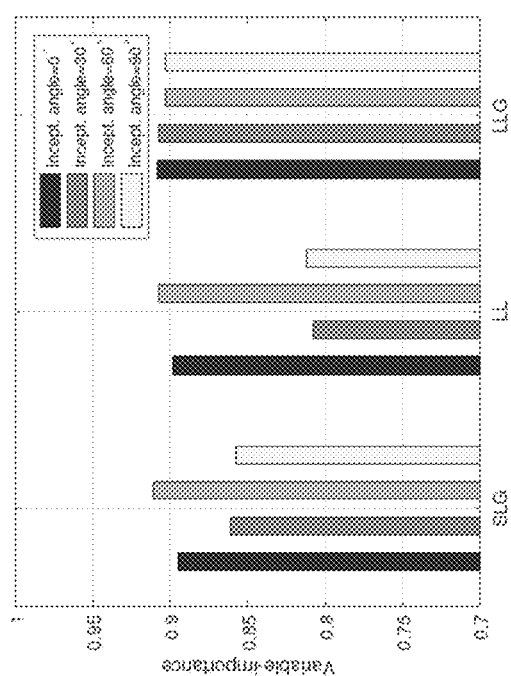
FIG. 11B is a graphical representation of variable-importance evaluations of LLLG fault features at different fault inception angles.
Figure 11C:
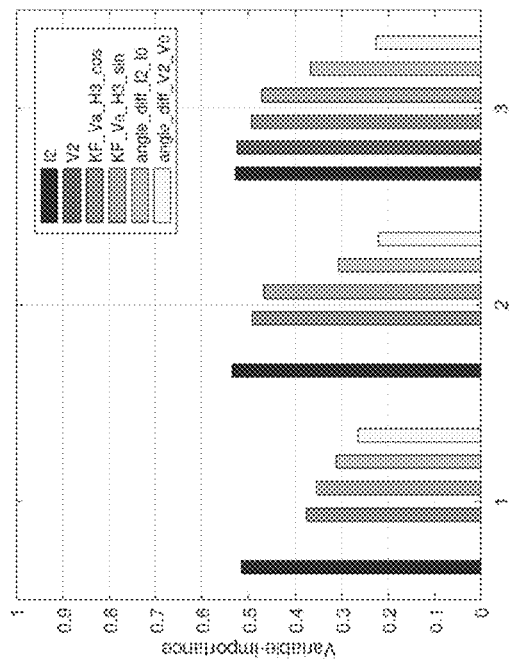
FIG. 11C is a graphical representation of variable-importance evaluations across fault inception angles at different fault locations.

FIG. 11A is a graphical representation of variable-importance of a third harmonic of the received voltage signal ($KF_{V_a} \cos H3$) at different fault inception angles and fault types. FIG. 11B is a graphical representation of variable-importance evaluations of LLLG fault features at different fault inception angles. FIG. 11C is a graphical representation of variable-importance evaluations across fault inception angles at different fault locations.

Fault Inception Angle: The effect of fault inception angle was also examined. The results of unbalanced faults and three phase faults are selectively shown in FIGS. 11A-11C respectively. The results in these figures include a varying impedance from 30Ω to 500Ω.

The fault inception angle is an insignificant factor that can perturb variable importance. The angles of 30° and 60° result in a subtle decrease in the variable of importance of the KF estimated third harmonic, but the change is limited. For an LLLG fault, the first order harmonic components of current estimated by KF have a performance drop in non-zero angles.

Fault Location: The variable-importance of the features in EFS is presented at three fault locations (bus numbers refer to FIG. 4):

Location 1: Fault near Bus B-3;
Location 2: Fault near Bus B-11;
Location 3: Fault near Bus B-19;

The result is demonstrated in FIG. 11C, including all fault impedance and all fault inception angles in Table IV. The feature of negative sequence current continues to be unaffected at each location. However, the negative sequence of voltage is so low at locations 1 and 2 that the variable of importance becomes almost zero. As the strong voltage source from the substation is ideally balanced, the negative sequence voltage deviation contributed from the HIF is weak. Location 3 is far from the substation, so the negative sequence voltage becomes a good HIF indicator again. To a negligible extent, it is similar for the variable of importance performance of other features: the further the fault is, the less compromised the features are.

C. Testing Results of the Effective Feature Set

The proposed EFS was tested under the aforementioned conditions in Table IV, but with dataset on different events. 1944 HIF events and another 1944 non-HIF events (they do not have to be the same number) are simulated for the training of the HIF detector 14 of FIG. 5. The types of testing events were similar to those of training events, but at different locations or with different parameter values. The testing included 972 HIF and 972 non-HIF events in total. In addition, five classical classifiers (Naive Bayes, Support Vector Machine, k-nearest neighbor, decision tree and random forest) from Weka were compared in order to find the best classifier.

The results with the proposed EFS under different classifiers, shown in Table IX, reveal the effectiveness of the feature selection. To limit problems such as over-fitting and inaccuracy in prediction, each classifier model was acquired through 10-fold cross-validation. The performance with Naive Bayes presented the lowest values. The accuracy of the other five classifiers were all above 90%, and remarkably, the performance of the selected artificial neural network (ANN) classifier was exceptionally good. This shows that the proposed EFS works well with most of the non-linear classifiers in HIF detection. However, due to the limited interpretability and debuggability of these classifiers, some linear logic from the tree based classifiers were adopted.

TABLE IX

| Classifier | A (%) | D (%) | S (%) |
|---|---|---|---|
| Naïve Bayes | 78.0 | 73.0 | 82.9 |
| SVM | 91.9 | 89.6 | 94.1 |
| k-nearest neighbor | 98.0 | 97.7 | 98.3 |
| Decision Tree | 99.4 | 99.5 | 99.3 |
| Random Forest | 99.7 | 99.7 | 99.8 |
| ANN | 100.0 | 100.0 | 100.0 |

D. The HIF Detection Logic and Classifiers

Derived from the tree structure of the machine learning classifier model, the proposed HIF detection logic aims to simplify the HIF detection process and be implemented in microprocessor-based relays. The logic complexity of the proposed technique in FIG. 5 is largely reduced. The trade-off here is the HIF detection performance. Fortunately, the discovery of the EFS guarantees a high detection accuracy (97% as shown in Table VII) in the proposed logic. On the other hand, although having excellent HIF detection performance, non-linear classifiers like ANNs still face the engineering challenge of being implemented in the digital relays. The multiple interconnected neurons and layers of ANNs require a higher performance CPU than the one in the digital relays.

The most computationally expensive parts in a machine learning-based HIF detection algorithm are usually the feature extraction and classifier. In the proposed algorithm, both the features and classifiers are obtained from offline simulation. Therefore, the offline simulation is computationally expensive. An Intel i7 CPU suffices for the majority of HIF detection simulation tasks. If the electric network and operational complexity increase significantly compared to the system under study, a GPU is required to conduct the offline simulation and obtain the settings. The proposed HIF detector 14 of FIG. 5, however, does not demand many computational resources and can be integrated into a microprocessor-based relay. FIGS. 5-7 elaborate on the implementation of this logic. If the non-linear classifiers in Table IX are to be implemented in a commercial relay for "real-time" operation, the hardware realization may include a CPU/GPU platform with parallel computation paradigms, a multiply and accumulate operation architecture to deal with the matrix-matrix product of the features and the weights, and a memory hierarchy to store data such as the network weights, etc.

E. Detection Under Low Current Magnitude Levels

The proposed HIF detection technique relies on time domain features. Therefore, its performance can be influenced when the fault current magnitude is low. In the 25 kV benchmark distribution network, the current magnitude in the case study of 500Ω fault impedance goes down to $(25000/\sqrt{3})/500 = 28.87$ A. The proposed EFS and HIF detection logic can still maintain a high detection performance (97.0% accuracy). Further tests indicate that the proposed method can detect a fault current down to 14 A (fault impedance up to 1000Ω) with the detection accuracy of 87.9%. However, as the fault impedance rises, the variable importance of some features like $\theta_{V_2} - \theta_{V_0}$ drop significantly (FIG. 10A). The precision issue is a problem for many HIF detection techniques. Although the proposed method cannot fully eliminate this problem, two mitigating approaches are recommended: (1) since the proposed technique utilizes the substation as its measurement point, multiple of the HIF detector 14 of FIG. 5 can be installed along the feeder to receive stronger signals and reduce measurement noise, and (2) measurement devices with higher precision can significantly improve detection performance under lower current magnitude levels.

V. Derivation of the Minimum Description Length

Assuming that all features are discrete, the objective is to find the best features that maximize the selection measure. Let C, A, and V denote the number of classes, the number of features, and the number of values of the given feature. With this notation, the following equations show the entropy of the classes ($H_C$), the values of the given feature ($H_A$), the joint events class-feature value ($H_{CA}$), and the classes given the value of the attribute ($H_{C|A}$).

$$H_C = -\Sigma_i p_{i.} \log p_{i.}, \quad H_A = -\Sigma_j p_{.j} \log p_{.j}$$

$$H_{CA} = -\Sigma_i \Sigma_j p_{ij} \log p_{ij}, \quad H_{C|A} = H_{CA} - H_A$$

where $p_{ij} = n_{ij}/n_{..}$, $p_{i.} = n_{i.}$, and $p_{.j} = n_{.j}/n_{..}$, $n_{..}$ denotes the number of training instances and $n_{i.}$ is the number of training instances from class $C_i$, $n_{.j}$ is the number of instances with the j-th value of the given attribute, and $n_{ij}$ is the number of instances from class $C_i$ and with the j-th value of the given attribute.

The approximation of the total number of bits that are needed to encode the classes of $n_{..}$ is:

$$\text{Prior } MDL' = n_{..} H_C + \log \binom{n_{..} + C - 1}{C - 1}$$

and the approximation of the number of bits to encode the classes of examples in all subsets corresponding to all values of the selected attribute is:

$$\text{Post } MDL' = \sum_j n_{.j} H_{C|j} + \sum_j \log \binom{n_{.j} + C - 1}{C - 1} + \log A$$

The last term (log A) is needed to encode the selection of an attribute among A attributes. However, this term is constant for a given selection problem and can be ignored. The first term equals $n_{..} H_{C|A}$. Therefore, the MDL' measure evaluates the average compression (per instance) of the message by an attribute. The measure is defined by the difference Prior MDL'−Post MDL', normalized with $n_{..}$:

$$MDL' = \text{Gain} + \frac{1}{n_{..}}\left(\log \binom{n_{..} + C - 1}{C - 1} - \sum_j \log \binom{n_{.j} + C - 1}{C - 1}\right)$$

However, entropy $H_C$ can be used to derive MDL' if the messages are of arbitrary length. If the length of the message is known, the more optimal coding uses the logarithm of all possible combinations of class labels for given probability distribution:

$$\text{Prior } MDL = \binom{n_{..}}{n_{1.}, \ldots, n_{C.}} + \log \binom{n_{..} + C - 1}{C - 1}$$

Similarly, if the priori minus the posterior of the MDL is used, Equation 1 is obtained. The MDL value in Equation 1 is the evaluation index we deployed for the variable-importance approach.

VI. Definition to the HIF Detection Evaluation Criteria

The concepts of true positive (TP), true negative (TN), false positive (FP), and false negative (FN) are borrowed from statistical classification. These concepts and their related evaluation criteria are defined as follows:

TP: the number of correctly detected fault events.
TN: the number of correctly detected non-fault events.
FP: the number of incorrectly detected fault events that are actually non-fault events.
FN: the number of incorrectly detected non-fault events that are actually fault events.

Accuracy:

$$A = \frac{TP + TN}{TP + FP + TN + FN}\%$$

Dependability:

$$D = \frac{TP}{TP + FN}\%.$$

Security:

$$S = \frac{TN}{TN + FP}\%.$$

Speed:

$$V = \frac{T_{one-cycle}}{T_{detection}}\%,$$

where $T_{one-cycle}$ and $T_{detection}$ are the time duration of one cycle and the detection time, respectively.

Objectivity (OBJ): the objectivity to fault type and network, indicating whether the technique is objective to the type of fault, and the network topology.

Completeness (COM): the ability to hold important information, indicating the time window of the data that is needed for the method to make the crucial decision for HIF.

Those skilled in the art will recognize improvements and modifications to the preferred embodiments of the present disclosure. All such improvements and modifications are considered within the scope of the concepts disclosed herein and the claims that follow.

What is claimed is:

1. A high impedance fault (HIF) detector, comprising:
a system characteristic averager configured to store instantaneous power characteristic values and provide averaged power characteristic values of the instantaneous power characteristic values;
a decision circuit configured to determine occurrence of an HIF based on the instantaneous power characteristic values and the averaged power characteristic values; and
a Kalman filter configured to provide a first portion of the instantaneous power characteristic values to the system characteristic averager after filtering a received voltage signal and a received current signal, wherein the first portion of the instantaneous power characteristic values comprises at least one of an estimated in-phase component of a third harmonic of the received voltage signal ($KF_{V_a} \cos H_{V3}$, $KF_{V_b} \cos H_{V3}$, or $KF_{V_c} \cos H_{V3}$) or an estimated in-quadrature component of a third harmonic of the received voltage signal ($KF_{V_a} \sin H_{V3}$, $KF_{V_b} \sin H_{V3}$, or $KF_{V_c} \sin H_{V3}$);
wherein KF is a Kalman Filter coefficient, $v_a$ is defined by a voltage of phase A, $v_b$ is defined by a voltage of phase B, and $v_c$ is defined by a voltage of phase C.

2. The HIF detector of claim 1, further comprising a comparison circuit configured to compare the instantaneous power characteristic values with the averaged power characteristic values to provide comparison values to the decision circuit.

3. The HIF detector of claim 1, further comprising a discrete Fourier transform (DFT) circuit configured to provide a second portion of the instantaneous power characteristic values to the system characteristic averager based on a DFT of the received voltage signal and the received current signal.

4. The HIF detector of claim 3, further comprising a comparison circuit configured to:
receive the instantaneous power characteristic values from the Kalman filter and the DFT circuit;
receive the averaged power characteristic values from the system characteristic averager; and
compare the instantaneous power characteristic values with the averaged power characteristic values to provide comparison values to the decision circuit.

5. The HIF detector of claim 1, further comprising a discrete Fourier transform (DFT) circuit configured to provide at least a portion of the instantaneous power characteristic values to the system characteristic averager based on a DFT of a received voltage signal and a received current signal.

6. The HIF detector of claim 5, wherein the at least the portion of the instantaneous power characteristic values provided by the DFT circuit to the system characteristic averager comprises a negative sequence voltage ($V_2$) and a negative sequence current ($I_2$).

7. The HIF detector of claim 6, wherein the at least the portion of the instantaneous power characteristic values provided by the DFT circuit further comprises an angle difference between the negative sequence voltage and a zero sequence voltage ($\theta_{V_2}-\theta_{V_0}$) and an angle difference between the negative sequence current and a zero sequence current ($\theta_{I_2}-\theta_{I_0}$).

8. The HIF detector of claim 1, wherein the instantaneous power characteristic values comprise an effective feature set.

9. The HIF detector of claim 8, wherein the effective feature set comprises at least one of: a negative sequence voltage ($V_2$), a negative sequence current ($I_2$), an angle difference between the negative sequence voltage and a zero sequence voltage ($\theta_{V_2}-\theta_{V_0}$), an angle difference between the negative sequence current and a zero sequence current ($\theta_{I_2}-\theta_{I_0}$), or a harmonic of a received voltage signal ($KF_V \cos H_{V3}$ or $KF_V \sin H_{V3}$).

10. A method for detecting a high impedance fault (HIF), comprising:
receiving power measurements from a power distribution system;
extracting an angle difference between a negative sequence voltage and a zero sequence voltage ($\theta_{V_2}-\theta_{V_0}$) from the power measurements; and
determining occurrence of an HIF based on the angle difference $\theta_{V_2}-\theta_{V_0}$.

11. The method of claim 10, wherein extracting the angle difference $\theta_{V_2}-\theta_{V_c}$ comprises performing a discrete Fourier transform (DFT) of a received voltage signal.

12. The method of claim 11, further comprising averaging the angle difference $\theta_{V_2}-\theta_{V_0}$ to produce an averaged angle difference $\theta_{V_2}-\theta_{V_0}$, wherein the HIF is determined based on comparing the averaged angle difference $\theta_{V_2}-\theta_{V_0}$ with the angle difference $\theta_{V_2}-\theta_{V_0}$.

13. The method of claim 10, further comprising:
extracting an effective feature set (EFS) comprising the angle difference $\theta_{V_2}-\theta_{V_0}$ and at least one of the negative sequence voltage ($V_2$), a negative sequence current ($I_2$), an angle difference between the negative sequence current and a zero sequence current ($\theta_{I_2}-\theta_{I_0}$), or a harmonic of a received voltage signal ($KF_V \cos H_{V3}$ or $KF_V \sin H_{V3}$); and
determining the occurrence of the HIF based on the EFS.

14. The method of claim 13, wherein extracting the EFS comprises performing a set of discrete Fourier transforms (DFTs) on a received voltage signal and a received current signal.

15. The method of claim 14, wherein extracting the EFS further comprises Kalman filtering the received voltage signal and the received current signal.

16. The method of claim 13, further comprising averaging the EFS to produce an averaged EFS, wherein the occurrence of the HIF is determined based on comparing the averaged EFS with the EFS.

17. A protective relay for a power distribution line, the protective relay comprising:
   a power coupler; and
   a high impedance fault (HIF) detector connected to the power coupler, comprising:
      feature extraction logic configured to extract instantaneous power characteristic values from a signal of the power coupler, the feature extraction logic comprising a Kalman filter that is configured to provide a first portion of the instantaneous power characteristic values after filtering a received voltage signal and a received current signal, the first portion of the instantaneous power characteristic values comprising at least one of an estimated in-phase component of a third harmonic of the received voltage signal ($KF_{V_a} \cos H_{V3}$, $KF_{V_b} \cos H_{V3}$, or $KF_{V_c} \cos H_{V3}$) or an estimated in-quadrature component of a third harmonic of the received voltage signal ($KF_{V_a} \sin H_{V3}$, $KF_{V_b} \sin H_{V3}$, or $KF_{V_c} \sin H_{V3}$);
      wherein KF is a Kalman Filter coefficient, $v_a$ is defined by a voltage of phase A, $v_b$ is defined by a voltage of phase B, and $v_c$ is defined by a voltage of phase C;
   a system characteristic averager configured to provide averaged power characteristic values from the instantaneous power characteristic values; and
   a decision circuit configured to determine occurrence of an HIF based on a comparison of the instantaneous power characteristic values with the averaged power characteristic values using a trained HIF model.

* * * * *